(12) United States Patent
Ikeda et al.

(10) Patent No.: US 8,653,730 B2
(45) Date of Patent: *Feb. 18, 2014

(54) LIGHT EMITTING ELEMENT AND DISPLAY DEVICE USING THE SAME

(75) Inventors: Hisao Ikeda, Kanagawa (JP); Junichiro Sakata, Kanagawa (JP); Daisuke Kumaki, Nigata (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/458,615

(22) Filed: Apr. 27, 2012

(65) Prior Publication Data

US 2012/0261659 A1 Oct. 18, 2012

Related U.S. Application Data

(63) Continuation of application No. 12/510,057, filed on Jul. 27, 2009, now Pat. No. 8,169,139, which is a continuation of application No. 10/579,691, filed as application No. PCT/JP2005/018215 on Sep. 26, 2005, now Pat. No. 7,569,988.

(30) Foreign Application Priority Data

Sep. 30, 2004 (JP) ................................. 2004-288408

(51) Int. Cl.
*H01J 1/62* (2006.01)
*H01J 63/04* (2006.01)

(52) U.S. Cl.
USPC ............ 313/506; 313/498; 313/503; 313/512

(58) Field of Classification Search
USPC ................................................. 313/498–512
See application file for complete search history.

(56) References Cited

U.S. PATENT DOCUMENTS 6,013,384 A 1/2000 Kido et al.
6,416,888 B1 7/2002 Kawamura et al.
(Continued)

FOREIGN PATENT DOCUMENTS

CN 100539241 C 9/2009
EP 0 855 848 A2 7/1998
(Continued)

OTHER PUBLICATIONS

Nakada, T. et al, "Multi Photon Emission Organic EL Devices Using Charge-Transfer Complex as Charge Generation Layer," IMES, Yamagata Univ., Extended Abstract, 27a-ZL-12, The 63$^{rd}$ Applied Physics-Related Combined Seminar, Seminar Proceedings (Niigata Univ.) Autumn Meeting, Sep. 24, 2002, p. 1165, (with English translation).

(Continued)

*Primary Examiner* — Anh Mai
*Assistant Examiner* — Kevin Quarterman
(74) *Attorney, Agent, or Firm* — Husch Blackwell LLP

(57) ABSTRACT

A light emitting element according to the invention comprises a plurality of layers which is interposed between a pair of electrodes, in which at least one of the plurality of layers is formed of a layer containing a light emitting material, and the layer containing a light emitting material is interposed between a layer containing an oxide semiconductor and/or metal oxide and a material having a higher hole transporting property than an electron transporting property, and a layer containing an oxide semiconductor and/or metal oxide, a material having a higher electron transporting property than a hole transporting property and a material which can donate electrons to the material having a higher electron transporting property than a hole transporting property.

12 Claims, 13 Drawing Sheets

(56) References Cited

U.S. PATENT DOCUMENTS

| | | | |
|---|---|---|---|
| 6,423,429 | B2 | 7/2002 | Kido et al. |
| 6,635,365 | B2 | 10/2003 | Kawamura et al. |
| 7,462,883 | B2 | 12/2008 | Kumaki et al. |
| 7,569,988 | B2 | 8/2009 | Ikeda et al. |
| 8,169,139 | B2 * | 5/2012 | Ikeda et al. ............ 313/506 |
| 2005/0073247 | A1 | 4/2005 | Yamazaki et al. |
| 2005/0098207 | A1 | 5/2005 | Matsumoto et al. |
| 2005/0173700 | A1 | 8/2005 | Liao et al. |
| 2005/0186446 | A1 | 8/2005 | Shitagaki et al. |
| 2005/0233166 | A1 | 10/2005 | Ricks et al. |
| 2005/0236973 | A1 | 10/2005 | Leo et al. |
| 2005/0264174 | A1 | 12/2005 | Liao et al. |
| 2006/0040132 | A1 | 2/2006 | Liao et al. |
| 2007/0040161 | A1 | 2/2007 | Kumaki et al. |
| 2007/0042221 | A1 | 2/2007 | Kawamura |
| 2007/0090376 | A1 | 4/2007 | Kumaki et al. |
| 2007/0114512 | A1 | 5/2007 | Kumaki et al. |
| 2007/0114527 | A1 | 5/2007 | Kumaki et al. |
| 2007/0114544 | A1 | 5/2007 | Kumaki et al. |
| 2007/0131948 | A1 | 6/2007 | Seo et al. |
| 2007/0200125 | A1 | 8/2007 | Ikeda et al. |

FOREIGN PATENT DOCUMENTS

| | | |
|---|---|---|
| EP | 0 948 063 A2 | 10/1999 |
| EP | 1 041 654 A1 | 10/2000 |
| EP | 1 083 776 A1 | 3/2001 |
| EP | 1 530 245 A2 | 5/2005 |
| EP | 1 631 125 A1 | 3/2006 |
| JP | 9-63771 | 3/1997 |
| JP | 10-270171 | 10/1998 |
| JP | 11-251067 | 9/1999 |
| JP | 2000-235893 | 8/2000 |
| JP | 2000-294376 | 10/2000 |
| JP | 2000-315581 | 11/2000 |
| JP | 2002-367784 | 12/2002 |
| JP | 2004-349007 | 12/2004 |
| JP | 2005-166637 | 6/2005 |
| JP | 2005-524966 | 8/2005 |
| JP | 2005-251587 | 9/2005 |
| WO | WO 2004/057686 A2 | 7/2004 |
| WO | WO 2006/035952 A1 | 4/2006 |

OTHER PUBLICATIONS

International Search Report re application No. PCT/JP2005/018215, dated Nov. 8, 2005.

Written Opinion re application No. PCT/JP2005/018215, dated Nov. 8, 2005.

Office Action re Chinese application No. CN 200910165595.5, dated Aug. 3, 2010 (with English translation).

* cited by examiner

LIGHT EMITTING ELEMENT AND DISPLAY DEVICE USING THE SAME

This application is a continuation of application Ser. No. 12/510,057 filed on Jul. 27, 2009 now U.S. Pat. No. 8,169,139 which is a continuation of application Ser. No. 10/579,691 filed on May 18, 2006 (now U.S. Pat. No. 7,569,988 issued Aug. 4, 2009) which claims priority under 35 USC 371 of PCT/JP2005/018215 filed Sep. 26, 2005.

TECHNICAL FIELD

The present invention relates to a light emitting element in which a plurality of layers is interposed between a pair of electrodes. The invention also relates to a display device using the light emitting element.

BACKGROUND ART

In recent years, a device utilizing light emission from an electroluminescent element (light emitting element) has attracted attention as a device for display, lighting, or the like. As the light emitting element used in such a device, well-known is a light emitting element in which a layer containing a light emitting compound is interposed between a pair of electrodes.

In such a light emitting element, a hole injected from one of the electrodes is recombined with an electron injected from the other to form an excited molecule. When the excited molecule returns to a ground state, light is emitted.

Meanwhile, there is a strong demand particularly for lower power consumption of a display device to be incorporated in various information processing devices which has been rapidly developed in recent years. In order to achieve this, it has been attempted to lower the drive voltage of the light emitting element. In view of commercialization, it is also important not only to lower the drive voltage but also to extend the life of the light emitting element. Thus, a light emitting element to achieve this is under development.

For example, Reference 1 aims to realize lower drive voltage and longer life of the light emitting element by using, as an anode, metal oxide with a high work function, such as molybdenum oxide (Reference 1: Japanese Patent Laid-Open No. 9-63771).

However, the method disclosed in Reference 1 cannot provide the element with sufficient reliability, and has not reached a practical level. Therefore, technology development to realize reliability or further longer life of the element has been needed.

DISCLOSURE OF INVENTION

It is an object of the invention to provide a highly reliable light emitting element with low drive voltage and longer life than a conventional light emitting element, and a display device using the light emitting element.

One feature of a light emitting element according to the invention is to comprise a plurality of layers which is interposed between a pair of electrodes opposed to each other, in which at least one of the plurality of layers is formed of a layer containing a light emitting material, and the layer containing a light emitting material is interposed between a layer containing an oxide semiconductor and/or metal oxide and a material having a higher hole transporting property than an electron transporting property and a layer containing an oxide semiconductor and/or metal oxide and a material having a higher electron transporting property than a hole transporting property.

Note that the plurality of layers in the above structure is formed by combining layers formed of a highly carrier injecting material, a highly carrier transporting material, and the like so that a light emitting region is formed away from the electrodes.

Another feature of a light emitting element according to the invention is to comprise a first layer, a second layer, and a third layer sequentially laminated between a first electrode and a second electrode opposed to each other, in which the first layer contains an oxide semiconductor and/or metal oxide and a material having a higher hole transporting property than an electron transporting property, the second layer contains a light emitting material, and the third layer contains an oxide semiconductor and/or metal oxide and a material having a higher electron transporting property than a hole transporting property.

Still another feature of a light emitting element according to the invention is to comprise a first layer, a second layer, a third layer, and a fourth layer sequentially laminated between a first electrode and a second electrode opposed to each other, in which the first layer contains an oxide semiconductor and/or metal oxide and a material having a higher hole transporting property than an electron transporting property, the second layer contains a light emitting material, the third layer contains an oxide semiconductor and/or metal oxide and a material having a higher electron transporting property than a hole transporting property, and the fourth layer contains an oxide semiconductor and/or metal oxide, a material having a higher electron transporting property than a hole transporting property, and a material which can donate electrons to the material having a higher electron transporting property than a hole transporting property.

Yet another feature of a light emitting element according to the invention is to comprise a first layer, a second layer, a third layer, and a fourth layer sequentially laminated between a first electrode and a second electrode opposed to each other, in which the first layer contains an oxide semiconductor and/or metal oxide and a material having a higher hole transporting property than an electron transporting property, the second layer contains a light emitting material, the third layer contains an oxide semiconductor and/or metal oxide, a material having a higher electron transporting property than a hole transporting property, and a material which can donate electrons to the material having a higher electron transporting property than a hole transporting property, and the fourth layer contains an oxide semiconductor and/or metal oxide and a material having a higher hole transporting property than an electron transporting property.

Further, another feature of a light emitting element according to the structure of the above-described light emitting element is to newly provide a layer containing an oxide semiconductor and/or metal oxide and a material having a higher hole transporting property than an electron transporting property so as to be in contact with the second electrode. Note that the layer to be newly provided may be formed using the same material as the first layer.

A light emitting element with little increase in resistance associated with thickening of a layer in the light emitting element can be obtained by a synergistic effect of forming the layer with a combination of an organic material and an inorganic material. Accordingly, a distance between the electrodes can be increased by forming a thick light emitting element interposed between a pair of electrodes, without increase in drive voltage. Therefore, a short circuit between the electrodes can be prevented and reliability of the light emitting element can be improved.

In addition, a highly reliable display device, which can prevent defects associated with a short circuit between the electrodes and withstand the use for a long period of time, can be obtained by applying the light emitting element obtained according to the invention to the display device.

BEST MODE FOR CARRYING OUT THE INVENTION

Figure 1A:
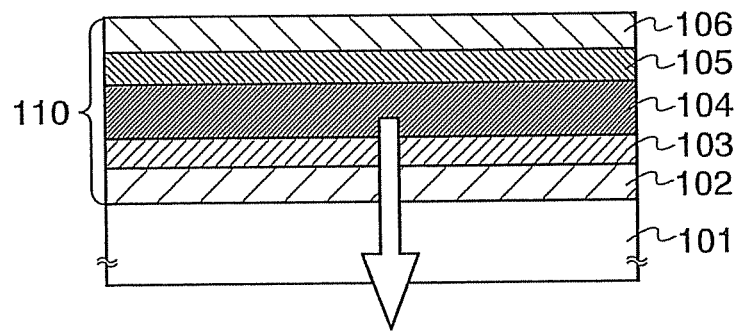
FIGS. 1A to 1C show a structure of a light emitting element according to the present invention.

Embodiment modes and embodiments of the present invention will be explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiment modes and embodiments. Note that the same reference numeral is commonly used to denote the same component among the different drawings in the structure of the present invention described below.

Embodiment Mode 1

In this embodiment mode, one mode of a light emitting element is hereinafter explained with reference to FIGS. 1A to 1C.

Figure 1B:
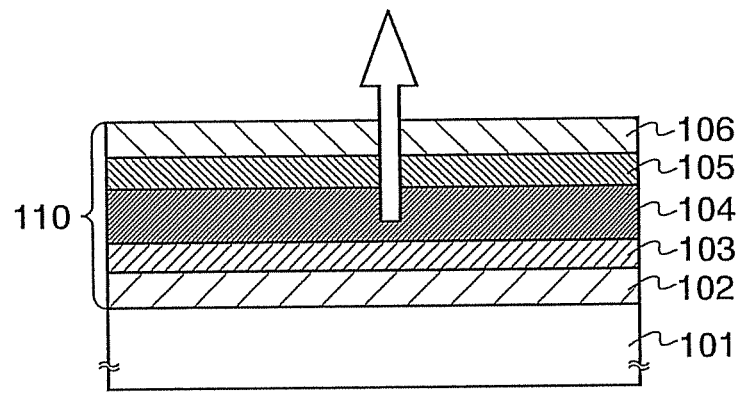
Figure 1C:
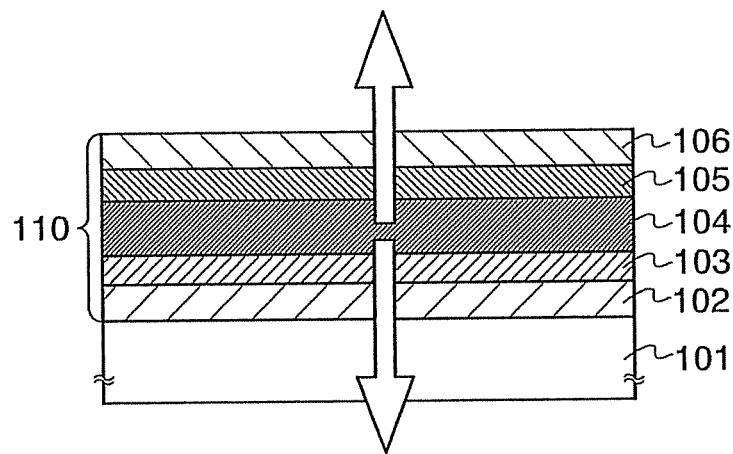

In this embodiment mode, a light emitting element 110 is provided over a substrate 101 for supporting it, and includes a first electrode 102, a first layer 103, a second layer 104, and a third layer 105 sequentially laminated over the first electrode 102, and a second electrode 106 provided thereover (FIGS. 1A to 1C).

The substrate 101 may be a glass substrate of, for example, barium borosilicate glass, aluminoborosilicate glass, or the like, a quartz substrate, a ceramic substrate, or the like. Alternatively, a substrate made from a synthetic resin having flexibility, such as plastics, may be used. Note that a surface of the substrate 101 may be planarized in advance by polishing with a CMP method.

The first electrode 102 is preferably formed of metal, an alloy, a conductive compound, a mixture thereof, or the like, having a high work function (preferably, of 4.0 eV or more). Specifically, a light-transmitting conductive oxide material such as indium tin oxide (ITO), zinc oxide (ZnO), indium zinc oxide (IZO), silicon-containing indium tin oxide, or gallium-doped zinc oxide (GZO) can be used. Alternatively, the first electrode 102 may have a single-layer or laminated structure of one of elements such as gold (Au), platinum (Pt), nickel (Ni), tungsten (W), chromium (Cr), molybdenum (Mo), iron (Fe), cobalt (Co), copper (Cu), palladium (Pd), aluminum (Al), manganese (Mn), and titanium (Ti), an alloy containing a plurality of the elements, or a layer containing the element and carbon (C). As the alloy containing a plurality of the elements, an alloy containing Al, Ti, and C, an alloy containing Al and Ni or Al and C, an alloy containing Al, Ni, and C, an alloy containing Al and Mo, or the like can be used. When Al is used for the electrode, it has an advantage of high reflectivity in the case where the electrode is intended to reflect light emitted from a light emitting layer.

The first layer 103 is a layer containing a compound selected from an oxide semiconductor or metal oxide and a highly hole transporting material. As a specific example of the oxide semiconductor or metal oxide, molybdenum oxide ($MoO_x$), vanadium oxide ($VO_x$), ruthenium oxide ($RuO_x$), tungsten oxide ($WO_x$), cobalt oxide ($CoO_x$), nickel oxide ($NiO_x$), copper oxide ($CuO_x$), or the like can be give. Alternatively, indium tin oxide (ITO), zinc oxide (ZnO), or the like can be used. As a highly hole transporting material, an aromatic amine compound (in other words, a compound having a benzene ring-nitrogen bond) such as 4,4'-bis[N-(1-naphthyl)-N-phenylamino]biphenyl (abbr.: α-NPD), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), or 4,4'-bis(N-(4-(N,N-di-m-tolylamino)phenyl)-N-phenylamino)biphenyl (abbr.: DNTPD); or a phthalocyanine compound such as phthalocyanine (abbr.: $H_2Pc$), copper phthalocyanine (abbr.: CuPc), or vanadyl phthalocyanine (abbr.: VOPc) can be used. The materials described here are mainly materials having hole mobility of $10^{-6}$ $cm^2/Vs$ or more. However, a material other than the above-described materials may be used as long as it has a higher hole transporting property than an electron transporting property.

The first layer 103 having such a structure as described above is a highly hole injecting layer. In the first layer 103, aggregation of the oxide semiconductor or metal oxide is suppressed by the highly hole transporting material included in the layer. In other words, crystallization of the first layer 103 is suppressed. Note that the first layer 103 may have not only such a single layer structure as described above but also a laminated structure of two or more layers, for example, layers containing a semiconductor and a highly hole transporting compound and having different mixing ratios thereof. Since the above-described structure can suppress crystallization of the layer containing a compound selected from an oxide semiconductor or metal oxide and a material having a higher hole transporting property than an electron transporting property, a layer with little increase in resistance even when formed thickly can be formed.

The first layer 103 may also contains a compound having large steric hindrance (having not a planar structure but a spatial structure), in addition to the compound selected from an oxide semiconductor or metal oxide and the highly hole transporting compound. As the compound having large steric hindrance, 5,6,11,12-tetraphenyltetracene (abbr.: rubrene) is preferable. Alternatively, hexaphenylbenzene, t-butylperylene, 9,10-di(phenyl)anthracene, coumarin 545T, or the like can be used. Further, a dendrimer or the like is also effective.

The second layer 104 is formed of a layer containing a highly light emitting material. The second layer 104 containing a light emitting material is roughly divided into two types. One is a layer which contains a light emitting material to be a light emitting center, dispersed in a layer formed of a material having a larger energy gap than that of the light emitting material. The other is a layer in which a light emitting layer is formed only of a light emitting material. The former is a preferable structure, since concentration quenching is hard to occur in the former. As the light emitting material to be a light emitting center, 4-dicyanomethylene-2-methyl-6-[2-(1,1,7,7-tetramethyljulolidine-9-yl)ethenyl]-4H-pyran (abbr.: DCJT); 4-dicyanomethylene-2-t-butyl-6-[2-(1,1,7,7-tetramethyljulolidine-9-yl)ethenyl]-4H-pyran; periflanthene; 2,5-dicyano-1,4-bis[2-(10-methoxy-1,1,7,7-tetramethyl julolidine-9-yl)ethenyl]benzene; N,N'-dimethyl quinacridon (abbr.: DMQd); coumarin 6; coumarin 545T; tris(8-quinolinolato)aluminum (abbr.: $Alq_3$); 9,9'-bianthryl; 9,10-diphenylanthracene (abbr.: DPA); 9,10-bis(2-naphthyl)anthracene (abbr.: DNA); 2,5,8,1'-tetra-t-butylperylene (abbr.: TBP); or the like can be used. As a material to be a base material in the case of forming the layer in which the light emitting material is dispersed, an anthracene derivative such as 9,10-di(2-naphthyl)-2-tert-butylanthracene (abbr.: t-BuDNA), a carbazole derivative such as 4,4'-bis(N-carbazolyl)biphenyl (abbr.: CBP), a metal complex such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), bis(2-methyl-8-quinolinolato)-4-phenylphenolate-aluminum (abbr.: BAlq), bis[2-(2-hydroxypheyl)pyridinato]zinc (abbr.: $Znpp_2$), or bis[2-(2-hydroxypheyl)benzoxazolate]zinc (abbr.: ZnBOX), or the like can be used. As the material which can form the second layer 104 only of a light emitting material, tris(8-quinolinolato)aluminum (abbr.: $Alq_3$); 9,10-bis(2-naphthyl)anthracene (abbr.: DNA); bis(2-methyl-8-quinolinolato)-4-phenylphenolate-aluminum (abbr.: BAlq); or the like can be used.

The second layer 104 may be formed with a single layer or a plurality of layers. A hole transport layer may be provided between the layer in the second layer 104, in which a light emitting material is dispersed, and the first layer 103, and an electron transporting layer may be provided between the layer in the second layer 104, in which a light emitting material is dispersed, and the third layer 105. Either, both, or neither of these layers may be provided. As a material of the hole transporting layer, an aromatic amine compound (in other words, a compound having a benzene ring-nitrogen bond) such as 4,4'-bis[N-(1-naphthyl)-N-phenylamino]biphenyl (abbr.: α-NPD), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), or 4,4'-bis(N-(4-(N,N-di-m-tolylamino)phenyl)-N-phenylamino)biphenyl (abbr.: DNTPD); or a phthalocyanine compound such as phthalocyanine (abbr.: $H_2Pc$), copper phthalocyanine (abbr.: CuPc), or vanadyl phthalocyanine (abbr.: VOPc) can be used. As a material of the electron transporting layer, a metal complex having a quinoline skeleton or a benzoquinoline skeleton such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), or the like can be used. Alternatively, a material of a metal complex having an oxazole or triazole ligand such as bis[2-(2-hydroxyphenyl)benzoxazolate]zinc (abbr.: $Zn(BOX)_2$) or bis[2-(2-hydroxyphenyl)benzothiazolate]zinc (abbr.: $Zn(BTZ)_2$), or the like can be used. In addition to the metal complex, a compound such as 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), or bathocuproin (abbr.: BCP), or the like can be used.

The third layer 105 can be formed of a layer containing a compound selected from an oxide semiconductor or metal oxide and a highly electron transporting material. In this case, for example, lithium oxide ($LiO_x$), sodium oxide ($NaO_x$), or the like can be used as the oxide semiconductor or metal oxide.

The present invention is not limited to the above structure, and the third layer 105 may be formed of a layer containing a compound selected from an oxide semiconductor or metal oxide, a highly electron transporting material, an electron donating material which can donate electrons to the electron transporting material. In this case, as the oxide semiconductor or metal oxide, molybdenum oxide ($MoO_x$), vanadium oxide (VOA ruthenium oxide ($RuO_x$), tungsten oxide ($WO_x$), cobalt oxide ($CoO_x$), nickel oxide ($NiO_x$), copper oxide ($CuO_x$), or the like can be used. Alternatively, indium tin oxide (ITO), zinc oxide (ZnO), lithium oxide ($LiO_x$), sodium oxide ($NaO_x$), or the like can be used.

As the highly electron transporting material in the above structure, a material formed of a metal complex having a quinoline skeleton or a benzoquinoline skeleton such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), or the like can be used. Alternatively, a material of a metal complex having an oxazole or thiazole ligand such as bis[2-(2-hydroxyphenyl)benzoxazolate]zinc (abbr.: $Zn(BOX)_2$) or bis[2-(2-hydroxyphenyl)benzothiazolate]zinc (abbr.: $Zn(BTZ)_2$), or the like can be used. In addition to the metal complex, 2-(4-biphenylyl)-5-(4-tert-butylphenyl)-1,3,4-oxadiazole (abbr.: PBD); 1,3-bis[5-(p-tert-butylphenyl)-1,3,4-oxadiazole-2-yl]benzene (abbr.: OXD-7); 3-(4-tert-butylphenyl)-4-phenyl-5-(4-biphenylyl)-1,2,4-triazole (abbr.: TAZ); 3-(4-tert-butylphenyl)-4-(4-ethylphenyl)-5-(4-biphenylyl)-1,2,4-triazole (abbr.: p-EtTAZ); bathophenanthroline (abbr.: BPhen); bathocuproin (abbr.: BCP); or the like can be used. The materials described here are mainly materials having electron mobility of $10^{-6}$ $cm^2$/Vs or more. A material other than the above-described materials can be used for the third layer 105 as long as it has a higher electron transporting property than a hole transporting property. As the electron donating material which can donate electrons to the electron transporting material, alkali metal such as lithium (Li) or cesium (Cs), alkaline earth metal such as magnesium (Mg), calcium (Ca), or strontium (Sr), rare-earth metal such as erbium or ytterbium, a compound such as oxide or halide thereof, or the like can be employed. In addition, the third layer 105 may be not only a single layer but also a laminated layer of two or more layers formed of the above material. In addition to the above-described structure, a layer containing a compound selected from an oxide semiconductor or metal oxide, a highly hole transporting material, and an electron donating material which can donate electrons to the hole transporting material (a material having a function of promoting electron injection) may be used as the third layer 105.

Since the above-described structure can suppress crystallization of the third layer 105, a layer with little increase in resistance even when formed thickly can be formed.

The second electrode 106 is preferably formed of metal, an alloy, a conductive compound, a mixture thereof, or the like, having a low work function (preferably, of 3.8 eV or less). As a specific example of such a cathode material, transition metal containing rare-earth metal as well as an element belonging to Group 1 or 2 of the Periodic Table, in other words, alkali metal such as Li or Cs, alkaline earth metal such as Mg, Ca, or Sr, an alloy (Mg:Ag or Al:Li) or compound (LiF, CsF, or $CaF_2$) containing the above material can be used. Further, the second electrode 106 can be formed by laminating the above material and any of the materials used for the first electrode 102, or can be formed using any of the materials used for the first electrode 102.

The first layer 103, the second layer 104, and the third layer 105 can be formed by an evaporation method, an electron beam evaporation method, or a sputtering method. In addition, among these layers, a layer containing plural kinds of materials can be formed by simultaneously depositing each material. It can be formed by a combined method of the same kind or different kinds: a coevaporation method using resistance heating evaporation, a coevaporation method using electron beam evaporation, a coevaporation method using resistance heating evaporation and electron beam evaporation, film formation using resistance heating evaporation and sputtering, film formation using electron beam evaporation and sputtering, or the like. A layer containing three or more kinds of materials can also be formed by similarly combining the methods.

Alternatively, the layers may be formed by spin coating, a droplet discharging method, or a combination thereof with the above-described method. The droplet discharge method is a method for selectively discharging (jetting) droplets (also referred to as dots) of a composition including a material of a conductive film, an insulating film, or the like to form the film in an arbitrary position, and is also referred to as an inkjetting method depending on its mode. Different methods may be used to form each electrode or each layer.

In the light emitting element having the above-described structure, current flows due to a potential difference made between the first electrode 102 and the second electrode 106, a hole and an electrode are recombined in the second layer 104 that is a layer containing a highly light emitting material, and then, light is emitted. In other words, a light emitting region is formed in the second layer 104. However, the whole of the second layer 104 need not serve as a light emitting region. The light emitting region may be formed only on a first layer 103 side or a third layer 105 side of the second layer 104, for example.

Light emitted from the second layer 104 is extracted outside through either or both the first electrode 102 and the second electrode 106. Thus, either or both the first electrode 102 and the second electrode 106 are formed of a light-transmitting material. When only the first electrode 102 is formed of a light-transmitting material, light emitted from the second layer 104 is extracted to a substrate 101 side through the first electrode 102 as shown in FIG. 1A. When only the second electrode 106 is formed of a light-transmitting material, light emitted from the second layer 104 is extracted to the opposite side of the substrate 101 through the second electrode 106 as shown in FIG. 1B. When both the first electrode 102 and the second electrode 106 are found of a light-transmitting material, light emitted from the second layer 104 is extracted to both the substrate 101 side and the opposite side through the first electrode 102 and the second electrode 106 as shown in FIG. 1C.

Figure 5A:
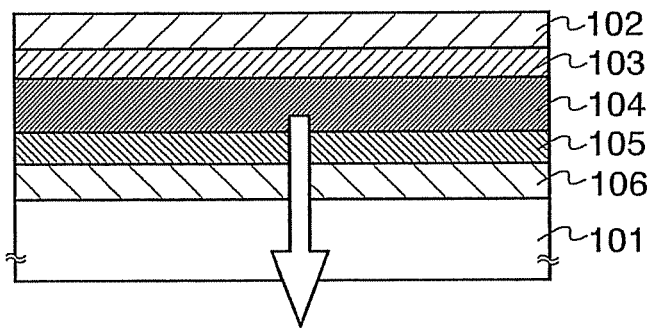
FIGS. 5A to 5C show a structure of a light emitting element according to the present invention.
Figure 5B:
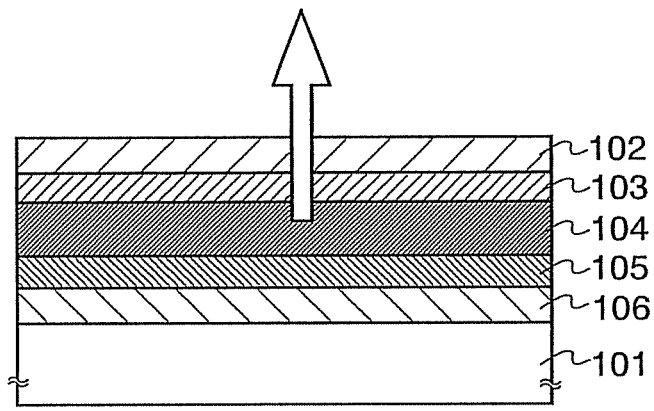
Figure 5C:
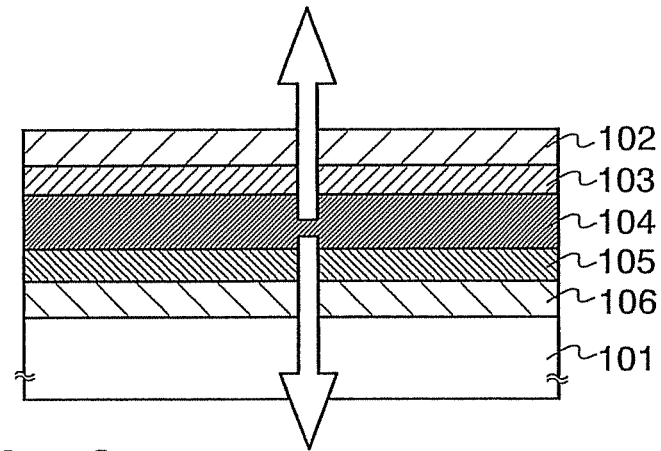

Note that, in this embodiment mode, the first electrode 102, the first layer 103, the second layer 104, the third layer 105, and the second electrode 106 are sequentially laminated over the substrate 101. However, the invention is not limited to this structure, and they may be laminated over the substrate 101 in reverse order of the above structure. In other words, the second electrode 106 may be formed over the substrate 101, the third layer 105, the second layer 104, and the first layer 103 may be sequentially laminated over the second electrode 106, and the first electrode 102 may be provided thereover as shown in FIGS. 5A to 5C. Even in this case, by forming either or both the first electrode 102 and the second electrode 106 of a light-transmitting material, light emitted from the second layer 104 can be extracted outside through either or both the first electrode 102 and the second electrode 106 as shown in FIGS. 5A to 5C.

In this embodiment mode, the light emitting element is manufactured over a substrate formed of glass, plastic, or the like. A passive display device can be manufactured by manufacturing a plurality of such light emitting elements over the substrate. The light emitting elements may be formed over, for example, a thin film transistor (TFT) array substrate other than the substrate formed of glass, plastic, or the like. According to this, an active matrix display device, in which the drive of the light emitting element is controlled by the TFT, can be manufactured. Note that the structure of the TFT is not particularly limited, and the TFT may be a staggered type or an inversely staggered type. Further, a driver circuit formed over the TFT array substrate may include either an n-type TFT or a p-type TFT, or both of them.

As described above, by forming the first layer and the third layer in which an organic material and an inorganic material are mixed, there is little increase in resistance even when these layers are formed thickly. Therefore, a light emitting element in which drive voltage does not increase even when formed thickly can be formed. Since the above-described structure can prevent crystallization of the first layer and the third layer, life of the light emitting element can be extended. Further, a short circuit between the electrodes can be prevented by forming the light emitting element thickly; accordingly, a highly reliable light emitting element can be obtained.

Embodiment Mode 2

In this embodiment mode, another mode of a light emitting element, which is different from that in the above embodiment mode, is explained with reference to FIGS. 2A to 2C. Note that, in this embodiment mode, the same reference numeral is used to denote the same component as in the above embodiment mode.

Figure 2A:
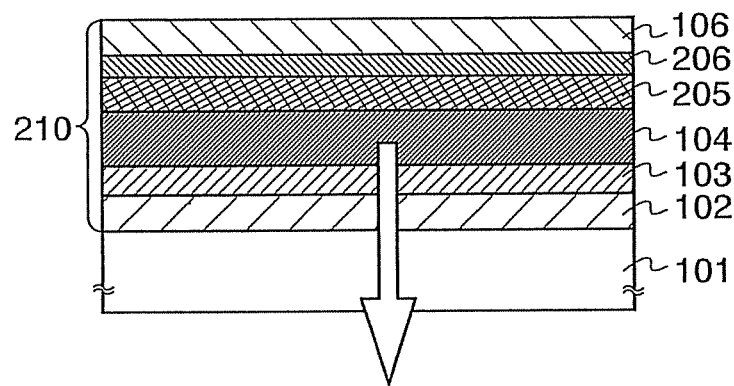
FIGS. 2A to 2C show a structure of a light emitting element according to the present invention.
Figure 2B:
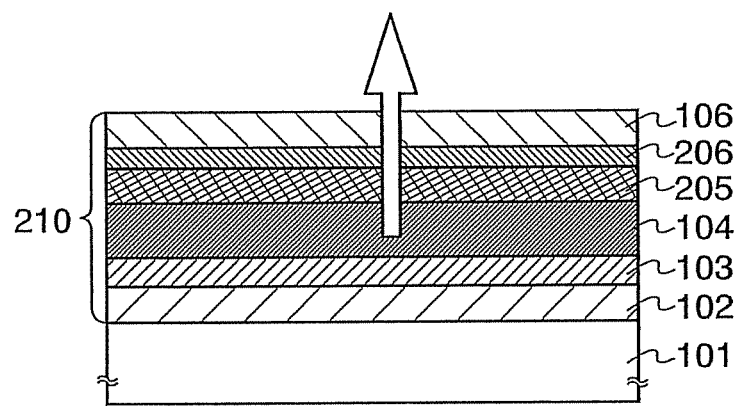
Figure 2C:
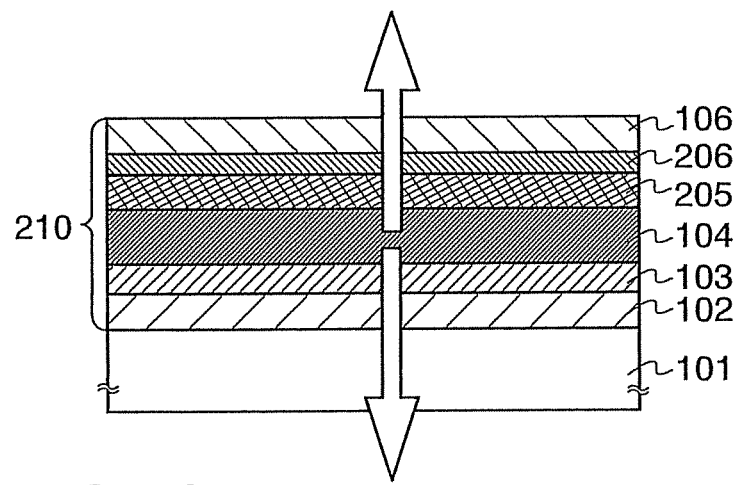

In this embodiment mode, a light emitting element 210 is provided over a substrate 101 for supporting it, and it includes a first electrode 102, a first layer 103, a second layer 104, a third layer 205, and a fourth layer 206 sequentially laminated over the first electrode 102, and a second electrode 106 provided thereover (FIGS. 2A to 2C). Note that the fourth layer 206 is formed using the same material as the third layer 105 in FIGS. 1A to 1C. In other words, in this embodiment mode, a layer is newly provided between the second layer 104 and the third layer 105 in the structure of the light emitting element 110 shown in FIGS. 1A to 1C.

The third layer 205 is formed of a layer containing a compound selected from an oxide semiconductor or metal oxide and a highly electron transporting material. As the oxide semiconductor or metal oxide, molybdenum oxide ($MoO_x$), vanadium oxide ($VO_x$), ruthenium oxide ($RuO_x$), tungsten oxide ($WO_x$), cobalt oxide ($CoO_x$), nickel oxide ($NiO_x$), copper oxide ($CuO_x$), or the like can be used. Alternatively, indium tin oxide (ITO), zinc oxide (ZnO), lithium oxide ($LiO_x$), sodium oxide ($NaO_x$), or the like can be used. As the highly electron transporting material, a material formed of a metal complex having a quinoline skeleton or a benzoquinoline skeleton such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), or the like can be used. Alternatively, a material of a metal complex having an oxazole or thiazole ligand such as bis[2-(2-hydroxyphenyl)benzoxazolate]zinc (abbr.: $Zn(BOX)_2$) or bis[2-(2-hydroxyphenyl)benzothiazolate]zinc (abbr.: $Zn(BTZ)_2$), or the like can be used. In addition to the metal complex, 2-(4-biphenylyl)-5-(4-tert-butylphenyl)-1,3,4-oxadiazole (abbr.: PBD); 1,3-bis[5-(p-tert-butylphenyl)-1,3,4-oxadiazole-2-yl]benzene (abbr.: OXD-7); 3-(4-tert-butylphenyl)-4-phenyl-5-(4-biphenylyl)-1,2,4-triazole (abbr.: TAZ); 3-(4-tert-butylphenyl)-4-(4-ethylphenyl)-5-(4-biphenylyl)-1,2,4-triazole (abbr.: p-EtTAZ); bathophenanthroline (abbr.: BPhen); bathocuproin (abbr.: BCP); or the like can be used. The materials described here are mainly materials having electron mobility of $10^{-6}$ $cm^2/Vs$ or more. A material other than the above-described material may be used for the third layer 205 as long as it has a higher electron transporting property than a hole transporting property. In addition, the third layer 205 may be not only a single layer but also a laminated layer of two or more layers formed of the above material.

Since the above-described structure can suppress crystallization of the third layer 205, a layer with little increase in resistance even when formed thickly can be formed.

Note that the first electrode 102, the second electrode 106, the first layer 103, the second layer 104, and the fourth layer 206 can each be formed of any of the materials described in the above embodiment mode. Light emitted from the second layer 104 is extracted outside through either or both the first electrode 102 and the second electrode 106. Thus, either or both the first electrode 102 and the second electrode 106 are formed of a light-transmitting material. When only the first electrode 102 is formed of a light-transmitting material, light emitted from the second layer 104 is extracted to a substrate 101 side through the first electrode 102 as shown in FIG. 2A. When only the second electrode 106 is formed of a light-transmitting material, light emitted from the second layer 104 is extracted to the opposite side of the substrate 101 through the second electrode 106 as shown in FIG. 2B. When both the first electrode 102 and the second electrode 106 are formed of a light-transmitting material, light emitted from the second layer 104 is extracted to both the substrate 101 side and the opposite side through the first electrode 102 and the second electrode 106 as shown in FIG. 2C.

Note that, in FIGS. 2A to 2C, the first electrode 102, the first layer 103, the second layer 104, the third layer 205, the fourth layer 206, and the second electrode 106 are sequentially laminated over the substrate 101. However, the invention is not limited to this structure, and they may be laminated over the substrate 101 in reverse order of the above structure.

In other words, the second electrode 106 may be formed over the substrate 101, the fourth layer 206, the third layer 205, the second layer 104, and the first layer 103 may be sequentially laminated over the second electrode 106, and the first electrode 102 may be provided thereover.

As described above, by forming the first layer, the third layer, and the fourth layer in which an organic material and an inorganic material are mixed, there is little increase in resistance even when these layers are formed thickly. Therefore, a light emitting element in which drive voltage does not increase even when formed thickly can be formed. Since the above-described structure can prevent crystallization of the first layer, the third layer, and the fourth layer, life of the light emitting element can be extended. Further, a short circuit between the electrodes can be prevented by forming the light emitting element thickly; accordingly, a reliable light emitting element can be obtained.

Note that this embodiment mode can be freely combined with the above embodiment mode.

Embodiment Mode 3

In this embodiment mode, another mode of a light emitting element, which is different from those in the above embodiment modes, is explained with reference to FIGS. 3A to 3C. Note that, in this embodiment mode, the same reference numeral is used to denote the same component as in the above embodiment mode.

Figure 3A:
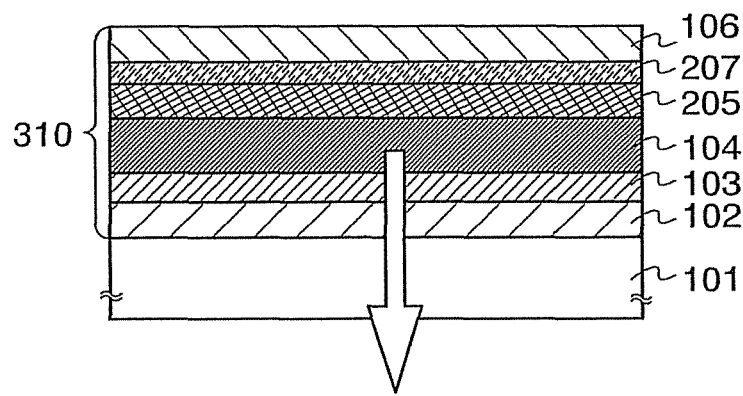
FIGS. 3A to 3C show a structure of a light emitting element according to the present invention.
Figure 3B:
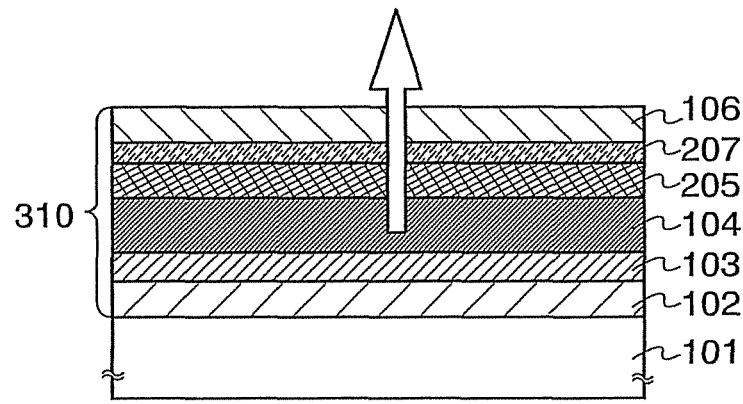
Figure 3C:
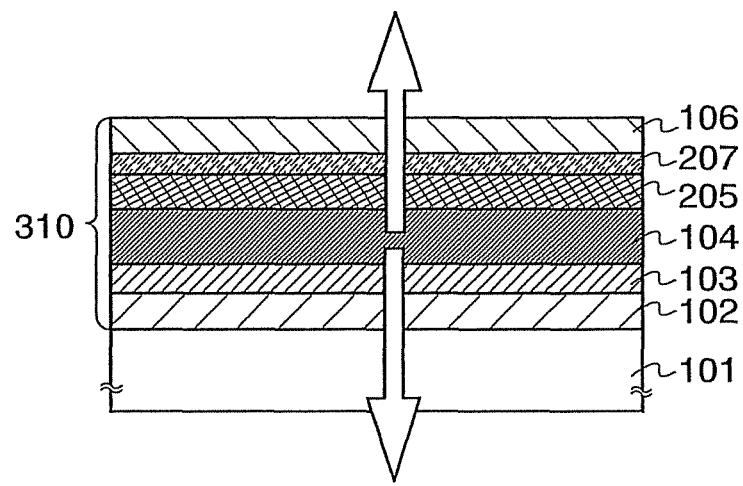

In this embodiment mode, a light emitting element 310 is provided over a substrate 101 for supporting it, and it includes a first electrode 102, a first layer 103, a second layer 104, a third layer 205, and a fourth layer 207 sequentially laminated over the first electrode 102, and a second electrode 106 provided thereover as shown in FIGS. 3A to 3C. In other words, the fourth layer 206 is replaced by a layer formed of a different material in the structure of the light emitting element 210 shown in FIGS. 2A to 2C.

The fourth layer 207 is formed of a layer containing both a highly electron transporting material and an electron donating material which can donate electrons to the electron transporting material (a material having a function of promoting electron injection). As the electron transporting material, a material formed of a metal complex having a quinoline skeleton or a benzoquinoline skeleton such as tris(8-quinolinolato)aluminum (abbr.: $Alq_3$), for example, tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), or the like can be used. Alternatively, a material of a metal complex having an oxazole or thiazole ligand such as bis[2-(2-hydroxyphenyl)benzoxazolate]zinc (abbr.: $Zn(BOX)_2$) or bis[2-(2-hydroxyphenyl)benzothiazolate]zinc (abbr.: $Zn(BTZ)_2$), or the like can be used. In addition to the metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used. As the electron donating material which can donate electrons to the electron transporting material, alkali metal such as lithium (Li) or cesium (Cs), alkaline earth metal such as magnesium (Mg), calcium (Ca), or strontium (Sr), rare-earth metal such as erbium or ytterbium, a compound such as oxide or halide thereof, or the like can be employed. Each electron donating material which can donate electrons is selected in accordance with the combination with the electron transporting material.

The invention is not limited to the above structure, and the fourth layer 207 may be formed only of the electron donating material which can donate electrons.

Note that the first electrode 102, the second electrode 106, the first layer 103, the second layer 104, and the third layer 205 can each be formed of any of the materials described in the above embodiment mode. Light emitted from the second layer 104 is extracted outside through either or both the first electrode 102 and the second electrode 106. Thus, either or both the first electrode 102 and the second electrode 106 are formed of a light-transmitting material. When only the first electrode 102 is formed of a light-transmitting material, light emitted from the second layer 104 is extracted to a substrate 101 side through the first electrode 102 as shown in FIG. 3A. When only the second electrode 106 is formed of a light-transmitting material, light emitted from the second layer 104 is extracted to the opposite side of the substrate 101 through the second electrode 106 as shown in FIG. 3B. When both the first electrode 102 and the second electrode 106 are formed of a light-transmitting material, light emitted from the second layer 104 is extracted to both the substrate 101 side and the opposite side through the first electrode 102 and the second electrode 106 as shown in FIG. 3C.

Note that, in FIGS. 3A to 3C, the first electrode 102, the first layer 103, the second layer 104, the third layer 205, the fourth layer 207, and the second electrode 106 are sequentially laminated over the substrate 101. However, the invention is not limited to this structure, and they may be laminated over the substrate 101 in reverse order of the above structure. In other words, the second electrode 106 may be formed over the substrate 101, the fourth layer 207, the third layer 205, the second layer 104, and the first layer 103 may be sequentially laminated over the second electrode 106, and the first electrode 102 may be provided thereover.

As described above, by forming the first layer and the third layer in which an organic material and an inorganic material are mixed, there is little increase in resistance even when these layers are formed thickly. Therefore, a light emitting element in which drive voltage does not increase even when formed thickly can be formed. Since the above-described structure can prevent crystallization of the first layer and the third layer, life of the light emitting element can be extended. Further, a short circuit between the electrodes can be prevented by forming the light emitting element thickly; accordingly, a highly reliable light emitting element can be obtained.

Note that this embodiment mode can be freely combined with the above embodiment mode.

Embodiment Mode 4

In this embodiment mode, another mode of a light emitting element, which is different from those in the above embodiment modes, is explained with reference to FIGS. 4A to 4C. Note that, in this embodiment mode, the same reference numeral is used to denote the same component as in the above embodiment mode.

Figure 4A:
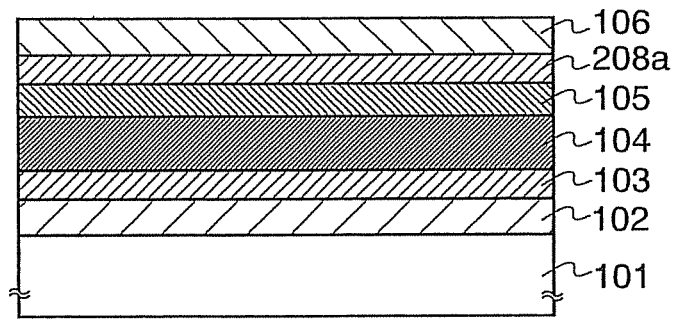
FIGS. 4A to 4C show a structure of a light emitting element according to the present invention.
Figure 4B:
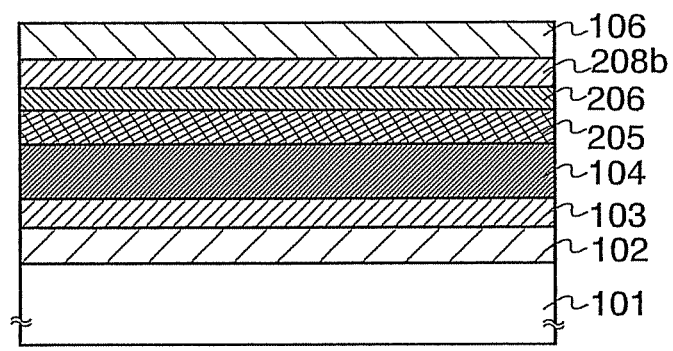
Figure 4C:
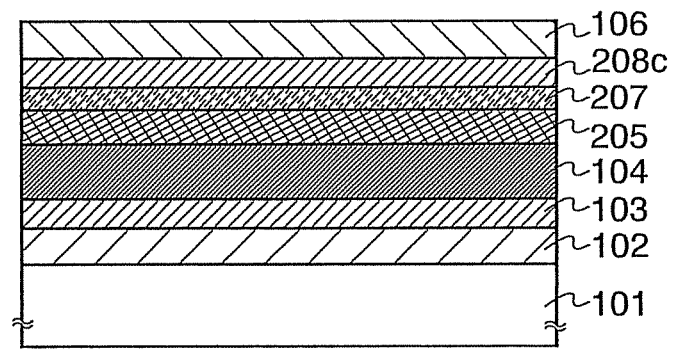

In this embodiment mode, a layer is newly provided to be in contact with the second electrode in the structure described in the above embodiment mode (FIGS. 4A to 4C). In other words, FIG. 4A shows a structure in which a fourth layer 208a is newly provided between the third layer 105 and the second electrode 106 in FIGS. 1A to 1C. FIG. 4B shows a structure in which a fifth layer 208b is newly provided between the fourth layer 206 and the second electrode 106 in FIGS. 2A to 2C. FIG. 4C shows a structure in which a fifth layer 208c is newly provided between the fourth layer 207 and the second electrode 106 in FIGS. 3A to 3C.

The newly provided layers 208a to 208c are formed using the same material as the first layer 103. In other words, each of them is formed of a layer containing a compound selected from an oxide semiconductor or metal oxide and a highly hole transporting material.

Note that, also in this embodiment mode as in the above embodiment mode, light emitted from the second layer 104 is extracted outside through either or both the first electrode 102 and the second electrode 106 when either or both the first electrode 102 and the second electrode 106 are formed using a light-transmitting material.

In FIG. 4A, the first electrode 102, the first layer 103, the second layer 104, the third layer 105, the fourth layer 208a, and the second electrode 106 are sequentially laminated over the substrate 101. However, the invention is not limited to this structure, and they may be laminated over the substrate 101 in reverse order of the above structure. In other words, the second electrode 106 may be formed over the substrate 101, the fourth layer 208a, the third layer 105, the second layer 104, and the first layer 103 may be sequentially laminated over the second electrode 106, and the first electrode 102 may be provided thereover. Also in FIG. 4B, the second electrode 106 may be formed over the substrate 101, the fifth layer 208b, the fourth layer 206, the third layer 205, the second layer 104, and the first layer 103 may be sequentially laminated over the second electrode 106, and the first electrode 102 may be provided thereover. Also in FIG. 4C, the second electrode 106 may be formed over the substrate 101, the fifth layer 208c, the fourth layer 207, the third layer 205, the second layer 104, and the first layer 103 may be sequentially laminated over the second electrode 106, and the first electrode 102 may be provided thereover.

As described above, by forming the layer in which an organic material and an inorganic material are mixed, there is little increase in resistance even when these layers are formed thickly. Therefore, a light emitting element in which drive voltage does not increase even when formed thickly can be formed. Since the above-described structure can prevent crystallization of a layer in which an organic material and an inorganic material are mixed, life of the light emitting element can be extended. Further, a short circuit between the electrodes can be prevented by forming the light emitting element thickly; accordingly, a highly reliable light emitting element can be obtained.

Note that this embodiment mode can be freely combined with the above embodiment mode.

Embodiment Mode 5

In this embodiment mode, one mode of a cross sectional view of a display device including the light emitting element described in the above embodiment mode is explained with reference to FIGS. 6A to 6C.

Figure 6A:
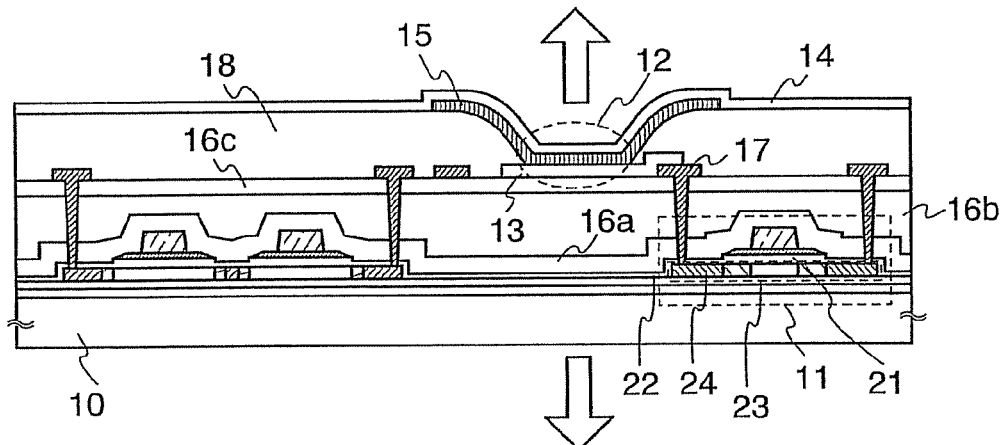
FIGS. 6A to 6C show a cross section of a display device using a light emitting element according to the present invention.
Figure 6B:
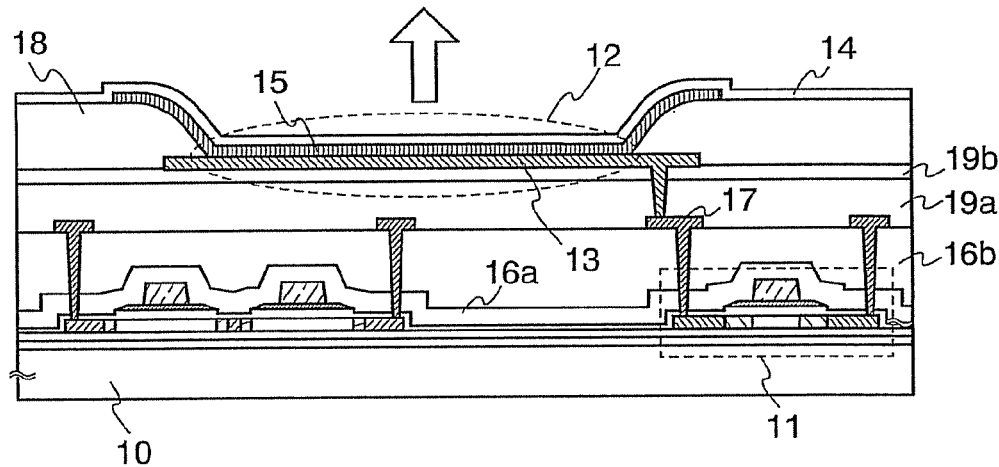
Figure 6C:
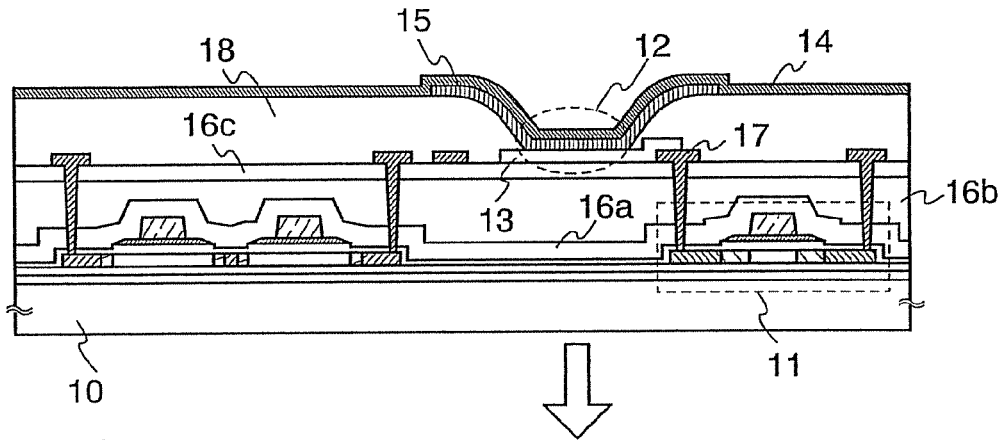

In FIGS. 6A to 6C, a portion surrounded by dotted lines in a rectangular shape is a transistor 11 which is provided to drive a light emitting element 12 of the invention. The light emitting element 12, in which a layer 15 where a plurality of layers is laminated is interposed between a first electrode 13 and a second electrode 14, has any one of the structures described in the above embodiment modes. A drain of the transistor 11 is electrically connected to the first electrode 13 by a wiring 17 penetrating a first interlayer insulating film 16 (16a, 16b, and 16c). The light emitting element 12 is separated from other adjacently-provided light emitting elements by a barrier layer 18. The display device having such a structure is provided over a substrate 10 in this embodiment mode.

Note that each of the transistors 11 shown in FIGS. 6A to 6C is a top gate type in which a gate electrode is provided opposite to a substrate, with a semiconductor layer interposed therebetween. However, there is no particular limitation on the structure of the transistor 11; for example, a bottom gate type may be used. In the case of a bottom gate type, the transistor 11 may have a structure in which a protective film is formed over the semiconductor layer to be provided with a channel (a channel protective type) or a structure in which a part of the semiconductor layer to be provided with a channel has a depression (a channel etch type). Note that reference numeral 21 denotes a gate electrode; 22, a gate insulting film; 23, a semiconductor layer; 24, an n-type semiconductor layer; 17, an electrode; and 16a, a protective film.

Alternatively, the semiconductor layer included in the transistor 11 may be either crystalline or amorphous. Further, it may be semi-amorphous or the like.

Note that characteristics of the semi-amorphous semiconductor are as follows. It has an intermediate structure between an amorphous structure and a crystalline structure (including a single crystal and a polycrystal) and a third state which is stable in terms of free energy, and it includes a crystalline region having short-range order and lattice distortion. At least a part of a region in the film contains a crystal grain of 0.5 nm to 20 nm. A Raman spectrum is shifted to a lower wavenumber side than 520 $cm^{-1}$. A diffraction peak of (111) or (220) to be caused by a crystal lattice of silicon is observed in X-ray diffraction. Hydrogen or halogen of 1 atomic % or more is contained to terminate a dangling bond. It is also referred to as a microcrystalline semiconductor. The semi-amorphous semiconductor is formed by performing glow discharge decomposition (plasma CVD) on a silicide gas. $SiH_4$ is given as the silicide gas. In addition, $Si_2H_6$, $SiH_2Cl_2$, $SiHCl_3$, $SiCl_4$, $SiF_4$, or the like can also be used as the silicide gas. The silicide gas may be diluted with $H_2$, or $H_2$ and one or more rare gas elements of helium, argon, krypton, and neon. A dilution ratio thereof may range from 2 times to 1000 times; pressures, approximately 0.1 Pa to 133 Pa; power supply frequency, 1 MHz to 120 MHz, preferably, 13 MHz to 60 MHz. A substrate heating temperature may be 300° C. or less, preferably, 100° C. to 250° C. A concentration of an atmospheric constituent impurity such as oxygen, nitrogen, or carbon, as an impurity element in the film, is preferably $1\times10^{20}/cm^3$ or less; specifically, a concentration of oxygen is $5\times10^{19}/cm^3$ or less, preferably $1\times10^{19}/cm^3$ or less. Note that mobility of a TFT (thin film transistor) using the semi-amorphous semiconductor is approximately 1 $cm^2/Vsec$ to 10 $cm^2/Vsec$.

As a specific example of the crystalline semiconductor layer, a layer formed of single-crystal or polycrystalline silicon, silicon germanium, or the like can be given. It may be formed by laser crystallization or may be formed by crystallization through a solid phase growth method using, for example, nickel.

When the semiconductor layer is formed of an amorphous substance, for example, amorphous silicon, a display device preferably has a circuit in which the transistor 11 and all other transistors (transistors included in a circuit for driving a light emitting element) are all n-channel transistors. Other than that, a display device may have a circuit including either n-channel transistors or p-channel transistors, or a display device may have a circuit including both types of transistors.

The first interlayer insulating film 16 may have a multi-layer structure as shown in FIGS. 6A to 6C, or a single-layer structure. Note that the interlayer insulating film 16a is made from an inorganic material such as silicon oxide or silicon nitride; the interlayer insulating film 16b is made from acrylic, a siloxane material such as a siloxane resin, or a self-planarizing substance which can form a film by coating, such as silicon oxide. In addition, the interlayer insulating film 16c is made from a silicon nitride film containing argon (Ar). The siloxane material corresponds to a material including a Si—O—Si bond. Siloxane has a skeleton formed from a bond of silicon (Si) and oxygen (O). As a substituent, an organic group containing at least hydrogen (for example, an alkyl group or aromatic hydrocarbon) is used. A fluoro group may also be used as a substituent. Alternatively, an organic group containing at least hydrogen and a fluoro group may be used. Note that there is no particular limitation on materials forming each layer, and a material other than the foregoing materials may also be used. A layer made from a material other than the foregoing materials may be further combined. As described above, the first interlayer insulating film 16 may be formed with either an inorganic material or an organic material, or both of them.

The barrier layer 18 preferably has a shape in an edge portion, in which a curvature radius changes continuously. In addition, the barrier layer 18 is formed with acrylic, a siloxane material such as a siloxane resin, a resist, silicon oxide, or the like. Note that the bather layer 18 may be formed with either an inorganic material or an organic material, or both of them.

In FIGS. 6A and 6C, only the first interlayer insulating film 16 is provided between the transistor 11 and the light emitting element 12. However, as shown in FIG. 6B, a second interlayer insulating film 19 (19a and 19b) may also be provided in addition to the first interlayer insulating film 16 (16a and 16b). In the display device shown in FIG. 6B, the first electrode 13 penetrates the second interlayer insulating film 19 and connects to the wiring 17.

The second interlayer insulating film 19 may have a multi-layer structure or a single-layer structure like the first interlayer insulating film 16. The second interlayer insulating film 19a is made from acrylic, a siloxane material such as a siloxane resin, or a self-planarizing substance which can form a film by coating, such as silicon oxide. The second interlayer insulating film 19b is formed with a silicon nitride film containing argon (Ar). Note that there is no particular limitation on materials forming each layer, and a material other than the foregoing materials can also be used. A layer made from a material other than the foregoing materials may be further combined. As described above, the second interlayer insulating film 19 may be formed with either an inorganic material or an organic material, or both of them.

When both the first electrode 13 and the second electrode 14 are formed from a light transmitting material in the light emitting element 12, light emission can be extracted through both the first electrode 13 and the second electrode 14 as indicated by the outlined arrow in FIG. 6A. When only the second electrode 14 is formed from a light-transmitting material, light emission can be extracted through only the second electrode 14 as indicated by the outlined arrow in FIG. 6B. In this case, it is preferable to form the first electrode 13 from a highly reflective material or provide a film formed from a highly reflective material (reflective film) below the first electrode 13. When only the first electrode 13 is formed from a light-transmitting material, light emission can be extracted through only the first electrode 13 as indicated by the outlined arrow in FIG. 6C. In this case, it is preferable to form the second electrode 14 from a highly reflective material or provide a reflective film above the second electrode 14.

When the first electrode or the second electrode is formed from a light-transmitting material, a light-transmitting conductive oxide material such as indium tin oxide (ITO), zinc oxide (ZnO), indium zinc oxide (IZO), silicon-containing indium tin oxide, or gallium-doped zinc oxide (GZO) can be used as a material for the first electrode or the second electrode.

On the other hand, when the first electrode or the second electrode is formed from a highly reflective material, an element selected from gold (Au), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), and titanium (Ti) or an alloy containing a plurality of the elements can be used as a material for forming the first electrode or the second electrode to be a single layer or have a laminated structure. Alternatively, for example, an alloy containing Al, Ti, and C, an alloy containing Al and Ni, an alloy containing Al and C, an alloy containing Al, Ni, and C, an alloy containing Al and Mo, or the like can be used. When Al or an Al alloy is used for the electrode; high reflectivity can be obtained. In the case of forming a reflective film, a similar material can also be used to form it.

In the light emitting element 12, the layer 15 may have such a laminated structure as to operate the light emitting element 12 when voltage is applied so that a potential of the second electrode 14 becomes higher than that of the first electrode 13, or the layer 15 may have such a laminated structure as to operate the light emitting element 12 when voltage is applied so that a potential of the second electrode 14 becomes lower than that of the first electrode 13. In the former case, the transistor 11 is an n-channel transistor, and in the latter case, the transistor 11 is a p-channel transistor.

As described above, an active display device in which drive of the light emitting element is controlled by the transistor is explained in this embodiment mode. However, a passive display device, in which the light emitting element is driven without particularly providing a drive element such as a transistor, may also be used. The passive display device can also be driven with low power consumption when it includes the light emitting element of the invention which operates at low drive voltage.

Note that this embodiment mode can be freely combined with the above embodiment mode.

Embodiment Mode 6

In this embodiment mode, a circuit structure of a display device having a display function is explained with reference to FIGS. 7 to 9.

Figure 7:
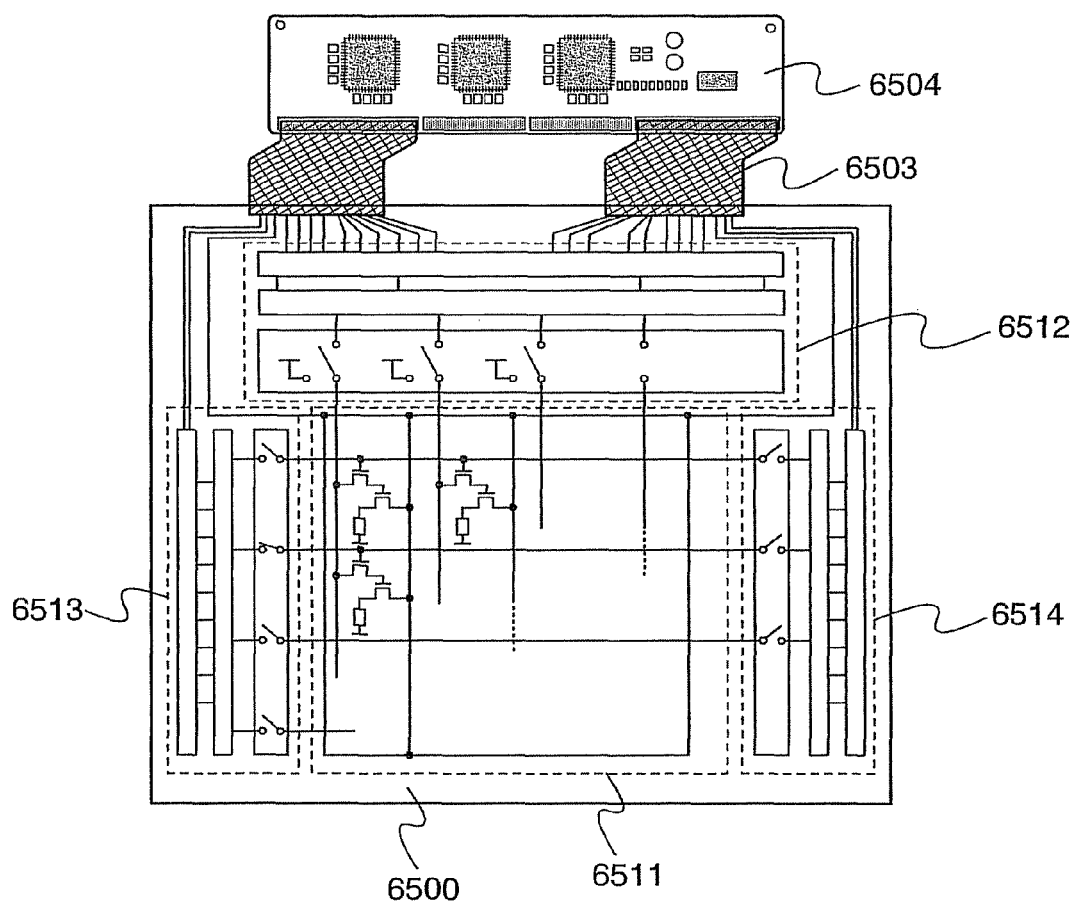
FIG. 7 shows an upper surface of a panel of a display device according to the present invention.

FIG. 7 is a schematic top view of a display device to which the light emitting element described in the above embodiment mode is applied. In FIG. 7, a pixel portion 6511, a source signal line driver circuit 6512, a write gate signal line driver circuit 6513, and an erase gate signal line driver circuit 6514 are provided over a substrate 6500. Each of the source signal line driver circuit 6512, the write gate signal line driver circuit 6513, and the erase gate signal line driver circuit 6514 is connected to a flexible printed circuit (FPC) 6503, which is an external input terminal, through a wiring group. Each of the source signal line driver circuit 6512, the write gate signal line driver circuit 6513, and the erase gate signal line driver circuit 6514 receives a video signal, a clock signal, a start signal, a reset signal, or the like from the FPC 6503. The FPC 6503 is provided with a printed wiring board (PWB) 6504. Note that a driver circuit portion need not necessarily be provided over the same substrate as the pixel portion 6511 as described above, and may be provided outside of the substrate by using, for example, an IC chip mounted on an FPC which is provided with a wiring pattern (TCP) or the like.

In the pixel portion 6511, a plurality of source signal lines extending in a column direction is arranged in a row direction. A current supply line is also arranged in a row direction. In addition, a plurality of gate signal lines extending in a row direction is arranged in a column direction in the pixel portion 6511. Further, plural sets of circuits each including a light emitting element are arranged in the pixel portion 6511.

Figure 8:
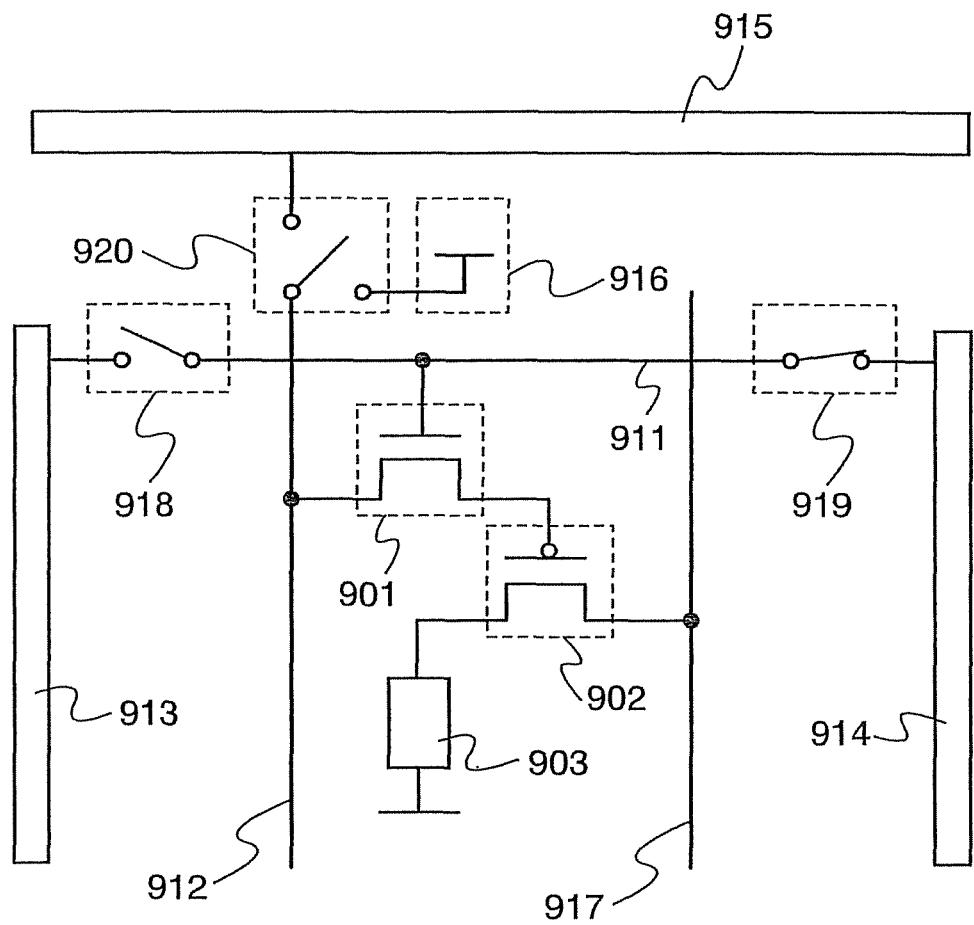
FIG. 8 shows a circuit in a pixel portion of a display device according to the present invention.
Figure 9:
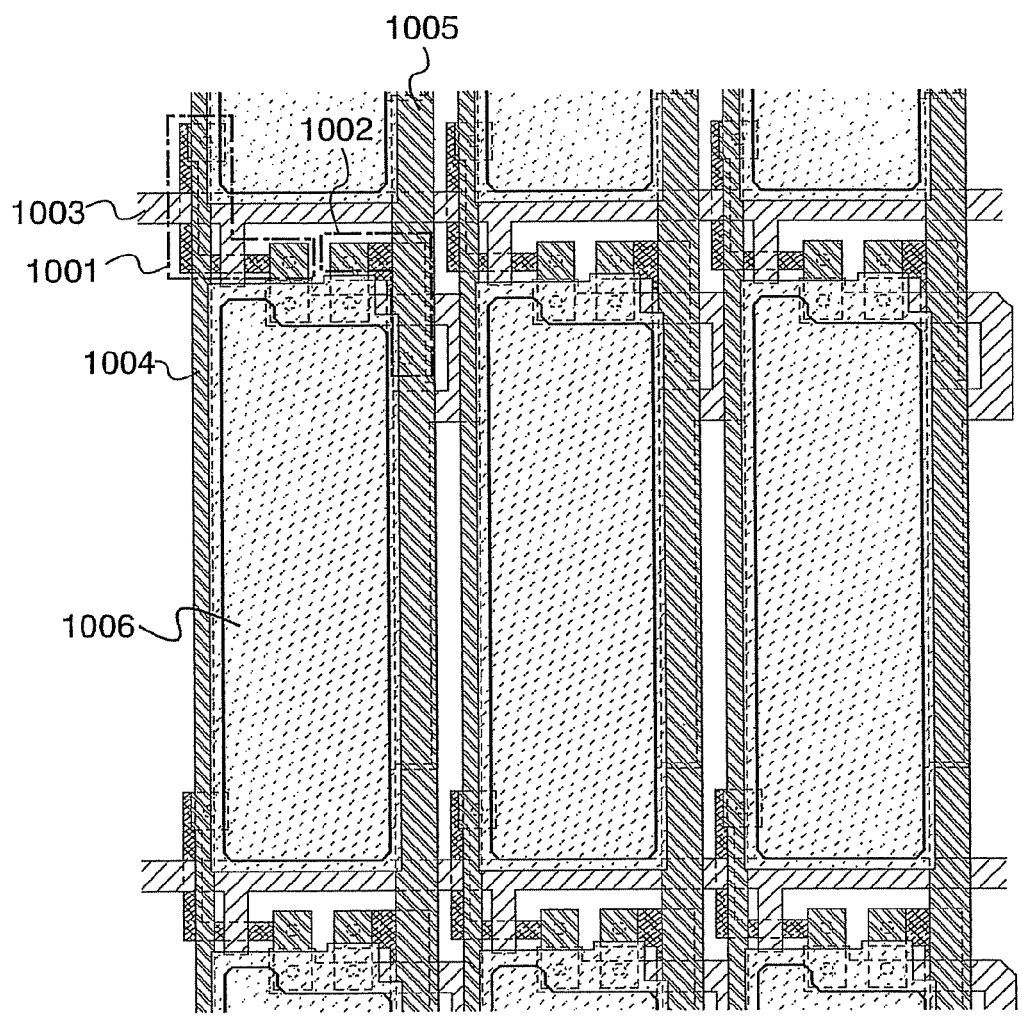
FIG. 9 shows a pixel portion of a display device using a light emitting element according to the present invention.

FIG. 8 shows a circuit for operating one pixel. The circuit shown in FIG. 8 includes a first transistor 901, a second transistor 902, and a light emitting element 903.

Each of the first transistor 901 and the second transistor 902 is a three-terminal element including a gate electrode, a drain region, and a source region, and has a channel region between the drain region and the source region. The source region and the drain region are interchanged depending on a structure, an operating condition, or the like of the transistor; thus, it is difficult to determine which is the source region or the drain region. Therefore, in this embodiment mode, regions each serving as a source or a drain are referred to as a first electrode and a second electrode.

A gate signal line 911 and a write gate signal line driver circuit 913 are provided to be electrically connected or not connected with each other via a switch 918. The gate signal line 911 and an erase gate signal line driver circuit 914 are provided to be electrically connected or not connected with each other via a switch 919. A source signal line 912 is provided to be electrically connected to either a source signal line driver circuit 915 or a power source 916 via a switch 920. The gate of the first transistor 901 is electrically connected to the gate signal line 911. The first electrode of the first transistor 901 is electrically connected to the source signal line 912, and the second electrode of the first transistor 901 is electrically connected to the gate electrode of the second transistor 902. The first electrode of the second transistor 902 is electrically connected to a current supply line 917, and the second electrode of the second transistor 902 is electrically connected to one electrode included in the light emitting element 903. The switch 918 may be included in the write gate signal line driver circuit 913. Further, the switch 919 may be included in the erase gate signal line driver circuit 914. Moreover, the switch 920 may be included in the source signal line driver circuit 915.

The arrangement of the transistor, the light emitting element, and the like in the pixel portion is not particularly limited. For example, the elements can be arranged as shown in a top view of FIG. 9. In FIG. 9, a first electrode of a first transistor 1001 is connected to a source signal line 1004, and a second electrode of the first transistor 1001 is connected to a gate electrode of a second transistor 1002. A first electrode of the second transistor 1002 is connected to a current supply line 1005, and a second electrode of the second transistor is connected to an electrode 1006 of a light emitting element. A part of a gate signal line 1003 serves as a gate electrode of the first transistor 1001.

The light emitting element described in the above embodiment mode is a highly reliable element with little increase in drive voltage that accompanies accumulation of light-emitting time. Thus, by applying the light emitting element to a pixel portion, a display device with little increase in power consumption can be obtained. In addition, the light emitting element described in the above embodiment mode can be thickened while suppressing increase in drive voltage, and a short circuit between electrodes can be easily prevented. Thus, by applying the light emitting element described in this embodiment mode to a pixel portion, a display device can be obtained which can display a favorable image with few defects caused by a short circuit.

Note that this embodiment mode can be freely combined with the above embodiment mode.

Embodiment Mode 7

Examples of display devices formed using the light emitting element described in the above embodiment mode can be given as follows: a video camera, a digital camera, a goggle type display (head mounted display), a navigation system, an audio reproducing device (car audio, an audio component, or the like), a computer, a game machine, a portable information terminal (a mobile computer, a cellular phone, a portable game machine, an electronic book, or the like), an image reproducing device including a recording medium (specifically, a device capable of processing data in a recording medium such as a digital versatile disc (DVD) and having a display which can display the image of the data), and the like. Practical examples of these display devices are shown in FIGS. 10A to 10H.

Figure 10A:
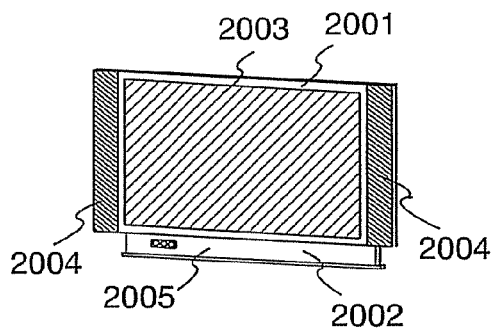
FIGS. 10A to 10H show display devices using a light emitting element according to the present invention.

FIG. 10A shows a TV set, which includes a chassis 2001, a support 2002, a display portion 2003, a loudspeaker portion 2004, a video input terminal 2005, or the like. The TV set can be manufactured by using the light emitting element described in the above embodiment mode for the display portion 2003. A clear image with few defects can be displayed at low drive voltage by using the light emitting element of the invention for the display portion 2003.

Figure 10B:
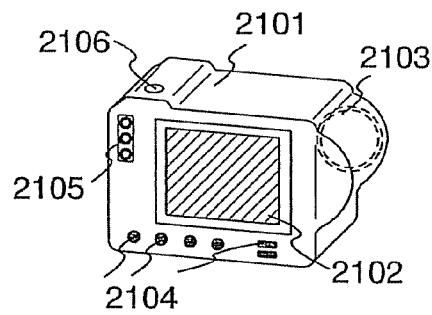

FIG. 10B shows a digital camera, which includes a main body 2101, a display portion 2102, an image receiving portion 2103, an operation key 2104, an external connection port 2105, a shutter 2106, or the like. The digital camera can be manufactured by using the light emitting element described in the above embodiment mode for the display portion 2102. A clear image with few defects can be displayed by using the light emitting element of the invention for the display portion 2102. Since it can be displayed at low drive voltage, battery life can be extended.

Figure 10C:
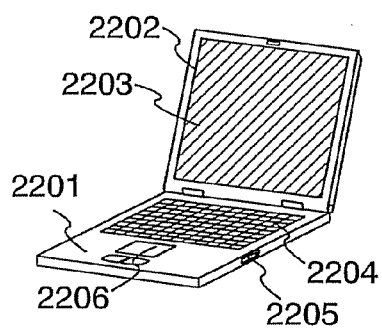

FIG. 10C shows a computer, which includes a main body 2201, a chassis 2202, a display portion 2203, a keyboard 2204, an external connection port 2205, a pointing mouse 2206, or the like. The computer can be manufactured by using the light emitting element described in the above embodiment mode for the display portion 2203. A clear image with few defects can be displayed at low drive voltage by using the light emitting element of the invention for the display portion 2203. Since it can be displayed at low drive voltage, battery life can be extended.

Figure 10D:
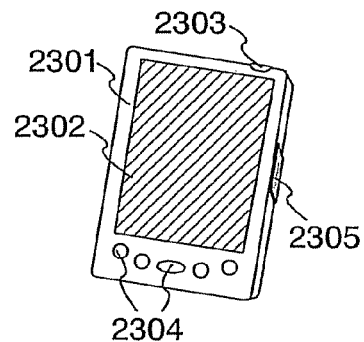

FIG. 10D shows a mobile computer, which includes a main body 2301, a display portion 2302, a switch 2303, an operation key 2304, an infrared port 2305, or the like. The mobile computer can be manufactured by using the light emitting element described in the above embodiment mode for the display portion 2302. A clear image with few defects can be displayed at low drive voltage by using the light emitting element of the invention for the display portion 2302. Since it can be displayed at low drive voltage, battery life can be extended.

Figure 10E:
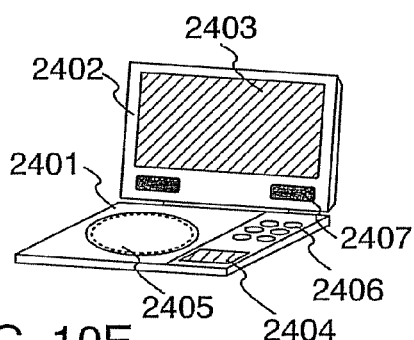

FIG. 10E shows a portable image reproducing device having a recording medium (a DVD reproducing device or the like), which includes a main body 2401, a chassis 2402, a display portion A 2403, a display portion B 2404, a recording medium (DVD or the like) reading portion 2405, an operation key 2406, a loudspeaker portion 2407, or the like. The display portion A 2403 mainly displays image information, and the display portion B 2404 mainly displays textual information. The image reproducing device can be manufactured by using the light emitting element described in the above embodiment mode for the display portion A 2403 and/or the display portion B 2404. Note that the image reproducing device having a recording medium includes a game machine and the like. A clear image with few defects can be displayed at low drive voltage by using the light emitting element of the invention for the display portion A 2403 and/or the display portion B 2404. Since it can be displayed at low drive voltage, battery life can be extended.

Figure 10F:
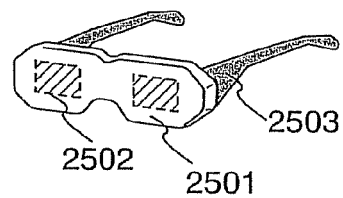

FIG. 10F shows a goggle type display (head mounted display), which includes a main body 2501, a display portion 2502, an arm portion 2503, or the like. The goggle type display can be manufactured by using the light emitting element described in the above embodiment mode for the display portion 2502. A clear image with few defects can be displayed at low drive voltage by using the light emitting element of the invention for the display portion 2502. Since it can be displayed at low drive voltage, battery life can be extended.

Figure 10G:
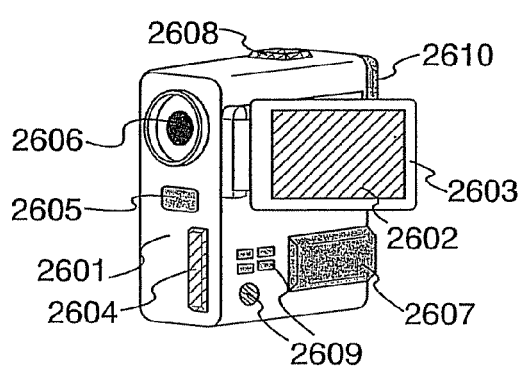

FIG. 10G shows a video camera, which includes a main body 2601, a display portion 2602, a chassis 2603, an external connection port 2604, a remote control receiving portion 2605, an image receiving portion 2606, a battery 2607, an audio input portion 2608, an operation key 2609, an eye piece portion 2610, or the like. The video camera can be manufactured by using the light emitting element described in the above embodiment mode for the display portion 2602. A clear image with few defects can be displayed at low drive voltage by using the light emitting element of the invention for the display portion 2602. Since it can be displayed at low drive voltage, battery life can be extended.

Figure 10H:
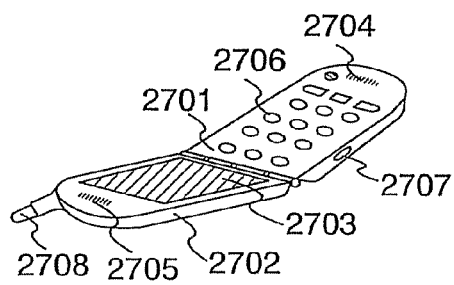

FIG. 10H shows a cellular phone, which includes a main body 2701, a chassis 2702, a display portion 2703, an audio input portion 2704, an audio output portion 2705, an operation key 2706, an external connection port 2707, an antenna 2708, or the like. The cellular phone can be manufactured by using the light emitting element described in the above embodiment mode for the display portion 2703. A clear image with few defects can be displayed at low drive voltage by using the light emitting element of the invention for the display portion 2703. Since it can be displayed at low drive voltage, battery life can be extended.

Note that the light emitting element can also be used for a front or rear projector as well as the above-described electronic devices.

As described above, the applicable range of the present invention is so wide that the invention can be applied to display devices in various fields. Note that this embodiment mode can be freely combined with the above embodiment mode.

Embodiment 1

In this embodiment, characteristics of the element structure described in the above embodiment mode are explained hereinafter.

In this embodiment, silicon-containing indium tin oxide is sputtered over a substrate to form a first electrode. Then, molybdenum (VI) oxide and NPB are co-evaporated over the first electrode to form a first layer containing molybdenum oxide ($MoO_x$) and NPB. Here, a mass ratio of molybdenum oxide to NPB is adjusted to be 1:4, and the first layer is formed to have a thickness of 50 nm. Note that co-evaporation is an evaporation method in which evaporation is simultaneously performed from a plurality of evaporation sources. Subsequently, NPB is vacuum-evaporated over the first layer to form a second layer containing NPB with a thickness of 10 nm. Next, tris(8-quinolinolato)aluminum (abbr.: $Alq_3$) and coumarin 6 are co-evaporated over the second layer to form a third layer containing $Alq_3$ and coumarin 6. Here, a mass ratio of $Alq_3$ to coumarin 6 is adjusted to be 1:0.005. This makes coumarin 6 dispersed in $Alq_3$. In addition, the third layer is formed to have a thickness of 40 mm. Thereafter, $Alq_3$ is vacuum-evaporated over the third layer to form a fourth layer containing $Alq_3$ with a thickness of 20 nm. Then, $Alq_3$ and $Li_2O$ (lithium oxide) are co-evaporated over the fourth layer to form a fifth layer containing $Alq_3$ and $Li_2O$. Here, a mass ratio of $Alq_3$ to $Li_2O$ is adjusted to be 1:0.01 (Element Structure 1) or 1:0.05 (Element Structure 2), and the fifth layer is faulted to have a thickness of 10 nm in either case. Subsequently, aluminum is vacuum-evaporated over the fifth layer to form a second electrode with a thickness of 200 nm.

Figure 13A:
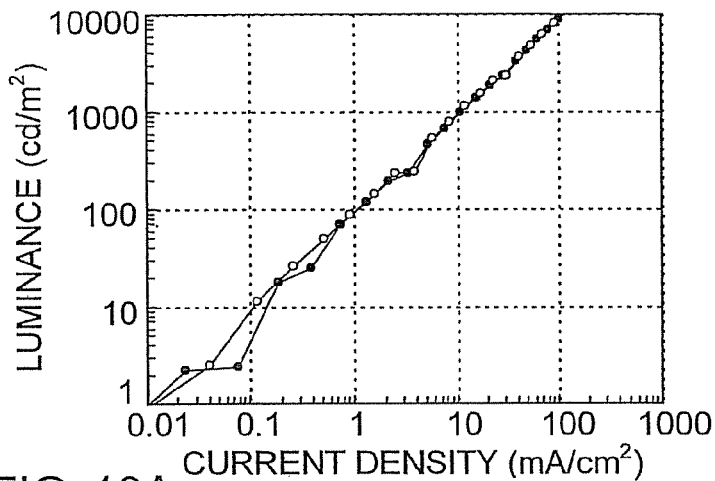
FIGS. 13A to 13C show characteristics of an element structure according to the present invention.
Figure 13B:
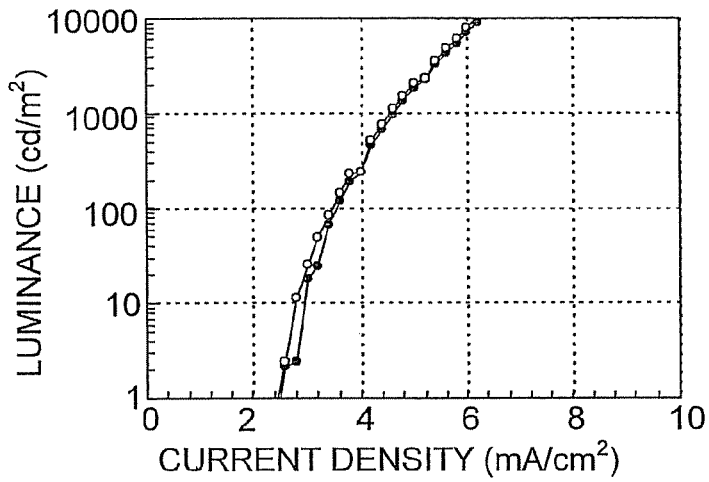
Figure 13C:
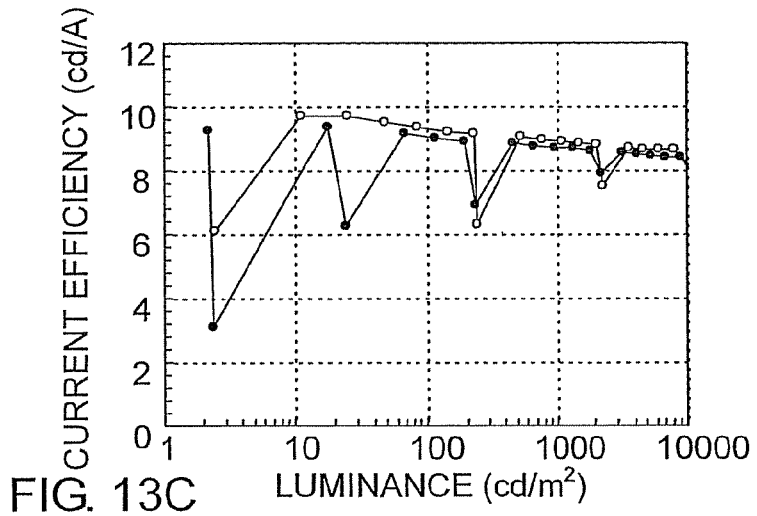

Hereinafter, characteristics of each element structure of Element Structure 1 and Element Structure 2 are described with reference to FIGS. 13A to 13C. Note that FIG. 13A shows current density-luminance characteristics; FIG. 13B, voltage-luminance characteristics; and FIG. 13C, luminance-current efficiency characteristics. In FIGS. 13A to 13C, • marks and ○ marks represent characteristics of light emitting elements of Element Structure 1 and that of Element Structure 2, respectively.

As to Element Structure 1, when a voltage of 4.6 V is applied, current flows with a current density of 11.1 $mA/cm^2$ and light is emitted with a luminance of 960 $cd/m^2$. A current efficiency at this time is 8.7 cd/A. As to Element Structure 2, when a voltage of 4.6 V is applied, current flows with a current density of 12.3 $mA/cm^2$ and light is emitted with a luminance of 1100 $cd/m^2$. A current efficiency at this time is 8.9 cd/A. Thus, it is found that high luminance can be obtained at low voltage by carrying out the invention.

Embodiment 2

In this embodiment, hereinafter explained are element characteristics when, in the layer containing a compound selected from an oxide semiconductor or metal oxide and a highly hole transporting material described in the above embodiment mode, the concentration of the oxide semiconductor or the metal oxide is changed.

In this embodiment, molybdenum oxide ($MoO_x$) is used as the oxide semiconductor or the metal oxide, and two materials, DNTPD and α-NPD, are used as the highly hole transporting material. Two element structures, Element Structure 3 and Element Structure 4, are manufactured. Then, element characteristics when the concentration of the molybdenum oxide is changed are examined with respect to each element structure.

First, a method for manufacturing Element Structure 3 is explained hereinafter.

Silicon-containing indium tin oxide is sputtered over a substrate to form a first electrode. Then, molybdenum oxide, DNTPD, and rubrene are co-evaporated over the first electrode to form a first layer containing molybdenum oxide, DNTPD, and rubrene. Here, the first layer is formed to have a thickness of 120 nm. Note that co-evaporation is an evaporation method in which evaporation is simultaneously performed from a plurality of evaporation sources. Subsequently, α-NPB is vacuum-evaporated over the first layer to form a second layer containing α-NPB. Here, the second layer is formed to have a thickness of 10 nm. Next, tris(8-quinolinolato)aluminum (abbr.: $Alq_3$) and coumarin 6 are co-evaporated over the second layer to form a third layer containing $Alq_3$ and coumarin 6. Here, a mass ratio of $Alq_3$ to coumarin 6 is adjusted to be 1:0.005. This makes coumarin 6 dispersed in $Alq_3$. The third layer is formed to have a thickness of 40 nm. Thereafter, $Alq_3$ is vacuum-evaporated over the third layer to form a fourth layer containing $Alq_3$. Here, the fourth layer is formed to have a thickness of 40 nm. Then, LiF is vacuum-evaporated over the fourth layer to form a fifth layer containing LiF. Here, the fifth layer is formed to have a thickness of 1 nm. Subsequently, aluminum is vacuum-evaporated over the fifth layer to form a second electrode. The second electrode is formed to have a thickness of 200 nm. A structure having the above configuration is referred to as Element Structure 3.

Next, a method for manufacturing Element Structure 4 is explained hereinafter.

Silicon-containing indium tin oxide is sputtered over a substrate to form a first electrode. Then, molybdenum oxide, α-NPD, and rubrene are co-evaporated over the first electrode to form a first layer containing molybdenum oxide, α-NPD, and rubrene. Here, the first layer is formed to have a thickness of 120 nm. Note that co-evaporation is an evaporation method in which evaporation is simultaneously performed from a plurality of evaporation sources. Subsequently, α-NPB is vacuum-evaporated over the first layer to form a second layer containing α-NPB. Here, the second layer is formed to have a thickness of 10 nm. Next, tris(8-quinolinolato)aluminum (abbr.: $Alq_3$) and coumarin 6 are co-evaporated over the second layer to form a third layer containing $Alq_3$ and coumarin 6. Here, a mass ratio of $Alq_3$ to coumarin 6 is adjusted to be 1:0.0025. This makes coumarin 6 dispersed in $Alq_3$. The third layer is formed to have a thickness of 37 nm. Thereafter, $Alq_3$ is vacuum-evaporated over the third layer to form a fourth layer containing $Alq_3$. Here, the fourth layer is formed to have a thickness of 37 nm. Then, $CaF_2$ is vacuum-evaporated over the fourth layer to form a fifth layer containing $CaF_2$. Here, the fifth layer is formed to have a thickness of 1 nm. Subsequently, aluminum is vacuum-evaporated over the fifth layer to form a second electrode. The second electrode is formed to have a thickness of 200 nm. A structure having the above configuration is referred to as Element Structure 4.

Figure 11:
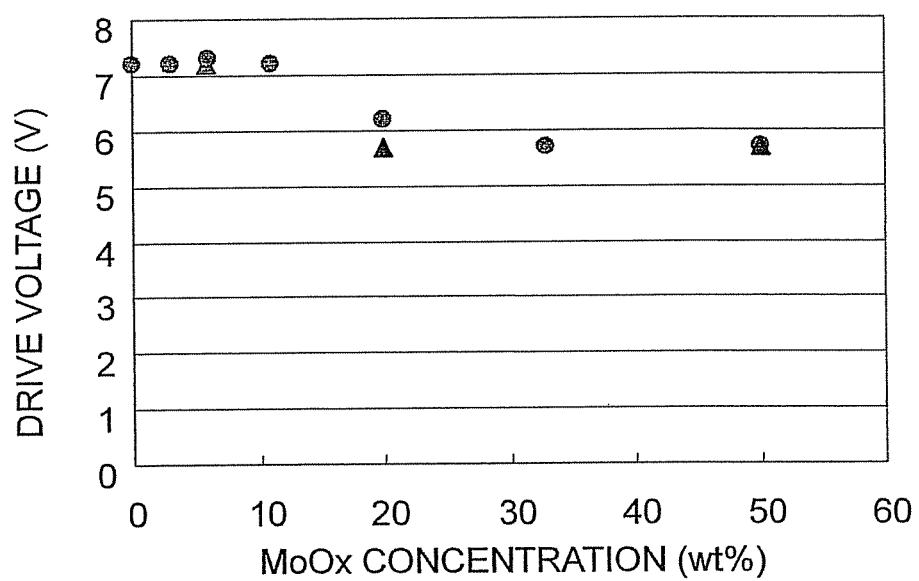
FIG. 11 shows $MoO_x$ concentration-drive voltage characteristics of a light emitting element.
Figure 12:
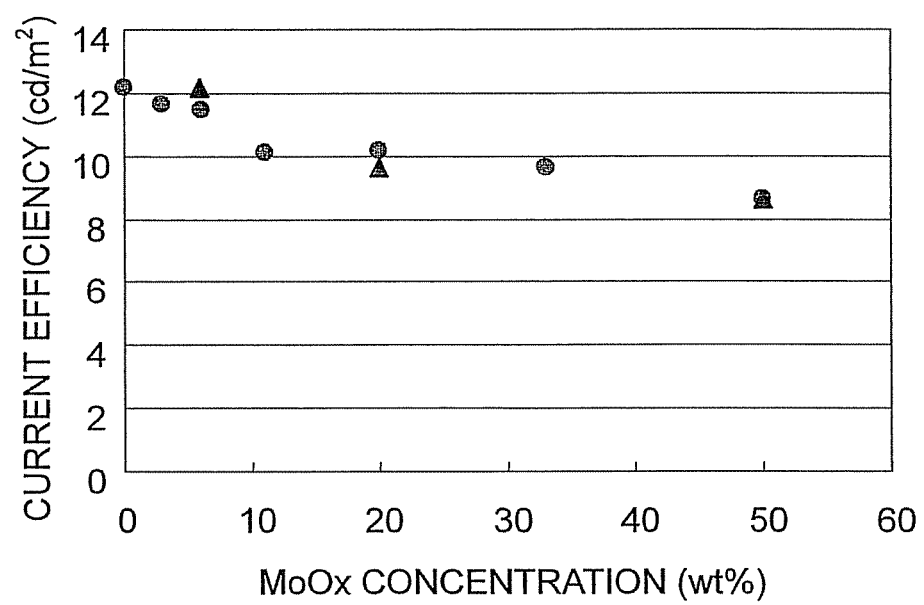
FIG. 12 shows $MoO_x$ concentration-current efficiency characteristics of a light emitting element.

FIG. 11 and FIG. 12 show molybdenum oxide concentration-chive voltage characteristics and molybdenum oxide concentration-current efficiency characteristics, respectively, at the time that each light emitting element of Element Structure 3 and Element Structure 4 has a luminance of 1000 $cd/m^2$. In FIG. 11, the horizontal axis represents a concentration (wt %) of molybdenum oxide, and the vertical axis represents a drive voltage (V) at a luminance of 1000 $cd/m^2$. In FIG. 12, the horizontal axis represents a concentration (wt %) of molybdenum oxide, and the vertical axis represents a current efficiency (cd/A) at a luminance of 1000 $cd/m^2$. In FIGS. 11 and 12, • marks and ▲ marks represent characteristics of light emitting elements of Element Structure 3 (light emitting element 1) and that of Element Structure 4 (light emitting element 2), respectively.

FIG. 11 shows that drive voltage of the light emitting element 1 and the light emitting element 2 at a luminance of 1000 $cd/m^2$ drastically decreases when the concentration of $MoO_x$ is in the range of 10 wt % to 30 wt % and stays constant thereafter. On the other hand, FIG. 12 shows that current efficiency of the light emitting element 1 and the light emitting element 2 at a luminance of 1000 $cd/m^2$ decreases as the concentration of $MoO_x$ increases. Therefore, in the case of using Element Structure 3 and Element Structure 4 described in this embodiment, the concentration of $MoO_x$ included in the first layer may be adjusted to be preferably 5 wt % to 50 wt %, more preferably, 15 wt % to 40 wt % to form the element structure.

Note that this embodiment can be freely combined with the above embodiment mode.

EXPLANATION OF REFERENCE

101: Substrate, 102: First electrode, 103: First layer, 104: Second layer, 105: Third layer, 106: Second electrode, 205: Third layer, 206: Fourth layer, 207: Fourth layer, 110: Light emitting element, 210: Light emitting element, 310: Light emitting element, 208a: Fourth layer, 208b: Fifth layer, 208c: Fifth layer, 10: Substrate, 11: Transistor, 12: Light emitting element, 13: First electrode, 14 Second electrode, 15: Layer, 16: Interlayer insulating film, 17: Wiring, 18: Barrier layer, 19: Interlayer insulating film, 6500: Substrate, 6503: flexible printed circuit (FPC), 6504: Printed wiring board (PWB), 6511: Pixel portion, 6512: Source signal line driver circuit, 6513: Write gate signal line driver circuit, 6514: Erase gate signal line driver circuit, 901: First transistor, 902: Second transistor, 903: Light emitting element, 911: Gate signal line, 912: Source signal line, 913: Write gate signal line driver circuit, 914: Erase gate signal line driver circuit, 915: Source signal line driver circuit, 916: Power source, 917: Current supply line, 918: Switch, 919: Switch, 920: Switch, 1001: First transistor, 1002: Second transistor, 1003: Gate signal line, 1004: Source signal line, 1005: Current supply line, 1006: Electrode, 2001: Chassis, 2002: Support, 2003: Display portion, 2004: Loudspeaker portion, 2005: Video input terminal, 2101: Main body, 2102: Display portion, 2103: Image receiving portion, 2104: Operation key, 2105: External connection port, 2106: Shutter, 2201: Main body, 2202: Chassis, 2203: Display portion, 2204: Keyboard, 2205: External connection port, 2206: Pointing mouse, 2301: Main body, 2302: Display portion, 2303: Switch, 2304: Operation key, 2305: Infrared port, 2401: Main body, 2402: Chassis, 2403: Display portion A, 2404: Display portion B, 2405: Recording medium (DVD) reading portion, 2406: Operation key, 2407: Loudspeaker portion, 2501: Main body, 2502: Display portion, 2503: Arm portion, 2601: Main body, 2602: Display portion, 2603: Chassis, 2604: External connection port, 2605: Remote control receiving portion, 2606: Image receiving portion, 2607: Battery, 2608: Audio input portion, 2609: Operation key, 2610: Eye piece portion, 2701: Main body, 2702: Chassis, 2703: Display portion, 2704: Audio input portion, 2705: Audio output portion, 2706: Operation key, 2707: External connection port, 2708: Antenna, 1: Light emitting element, and 2: Light emitting element.

The invention claimed is:

1. A light emitting device comprising:
a substrate having flexibility;
a first electrode over the substrate;
a second electrode;
a first layer containing an oxide semiconductor and a material having a higher hole transporting property than an electron transporting property, the first layer between the first electrode and the second electrode;
a second layer containing a light emitting material, the second layer between the first layer and the second electrode;
a third layer containing an oxide semiconductor and a material having a higher electron transporting property than a hole transporting property, the third layer between the second layer and the second electrode; and
a fourth layer containing an oxide semiconductor and a material having a higher hole transporting property than an electron transporting property, the fourth layer between the third layer and the second electrode.

2. The light emitting device according to claim 1, wherein the light emitting device is incorporated into a pixel portion of a display device.

3. The light emitting device according to claim 1, wherein the oxide semiconductor contained in the first layer is molybdenum oxide.

4. A light emitting device comprising:
a substrate having flexibility;
a first electrode over the substrate;
a second electrode;
a first layer containing a metal oxide and a material having a higher hole transporting property than an electron transporting property, the first layer between the first electrode and the second electrode;
a second layer containing a light emitting material, the second layer between the first layer and the second electrode;
a third layer containing a metal oxide and a material having a higher electron transporting property than a hole transporting property, the third layer between the second layer and the second electrode; and
a fourth layer containing an metal oxide and a material having a higher hole transporting property than an electron transporting property, the fourth layer between the third layer and the second electrode.

5. The light emitting device according to claim 4, wherein the light emitting device is incorporated into a pixel portion of a display device.

6. The light emitting device according to claim 4, wherein the metal oxide contained in the first layer is molybdenum oxide.

7. A light emitting device comprising:
a substrate having flexibility;
a first electrode over the substrate;
a second electrode;
a first layer containing an oxide semiconductor and a material having a higher hole transporting property than an electron transporting property, the first layer between the first electrode and the second electrode;
a second layer containing a light emitting material, the second layer between the first layer and the second electrode;
a third layer containing an oxide semiconductor, a material having a higher electron transporting property than a hole transporting property, and a material which can donate an electron to the material having a higher electron transporting property than a hole transporting property, the third layer between the second layer and the second electrode; and
a fourth layer containing an oxide semiconductor and a material having a higher hole transporting property than an electron transporting property, the fourth layer between the third layer and the second electrode.

8. The light emitting device according to claim 7, wherein the light emitting device is incorporated into a pixel portion of a display device.

9. The light emitting device according to claim 7, wherein the oxide semiconductor contained in the first layer is molybdenum oxide.

10. A light emitting device comprising:
a substrate having flexibility;
a first electrode over the substrate;
a second electrode;
a first layer containing a metal oxide and a material having a higher hole transporting property than an electron transporting property, the first layer between the first electrode and the second electrode;
a second layer containing a light emitting material, the second layer between the first layer and the second electrode;

a third layer containing a metal oxide, a material having a higher electron transporting property than a hole transporting property, and a material which can donate an electron to the material having a higher electron transporting property than a hole transporting property, the third layer between the second layer and the second electrode; and a fourth layer containing an metal oxide and a material having a higher hole transporting property than an electron transporting property, the fourth layer between the third layer and the second electrode.

11. The light emitting device according to claim 10, wherein the light emitting device is incorporated into a pixel portion of a display device.

12. The light emitting device according to claim 10, wherein the metal oxide contained in the first layer is molybdenum oxide.

\* \* \* \* \*

UNITED STATES PATENT AND TRADEMARK OFFICE
CERTIFICATE OF CORRECTION

PATENT NO. : 8,653,730 B2  
APPLICATION NO. : 13/458615  
DATED : February 18, 2014  
INVENTOR(S) : Hisao Ikeda et al.

It is certified that error appears in the above-identified patent and that said Letters Patent is hereby corrected as shown below:

In the Specification:

Column 5, Line 30; Change "DNA); 2,5,8,1'-tetra" to --DNA); 2,5,8,11-tetra--.

Column 5, Line 63; Change "MIDATA)," to --MTDATA),--.

Column 6, Line 8; Change "triazole" to --thiazole--.

Column 6, Line 33; Change "(VOA ruthenium" to --(VO$_X$), ruthenium--.

Column 8, Line 5; Change "found" to --formed--.

Column 14, Line 24; Change "bather" to --barrier--.

Column 15, Line 18; Change "electrode;" to --electrode,--.

Column 19, Line 5; Change "40 mm." to --40 nm.--.

Column 19, Line 12; Change "faulted" to --formed--.

Column 20, Line 38 to 39; Change "concentration-chive" to --concentration-drive--.

Signed and Sealed this  
First Day of July, 2014

Michelle K. Lee  
*Deputy Director of the United States Patent and Trademark Office*